(12) United States Patent
Uchida et al.

(10) Patent No.: US 7,886,427 B2
(45) Date of Patent: Feb. 15, 2011

(54) COMPONENT MOUNTING HEAD

(75) Inventors: Hideki Uchida, Yamanashi (JP); Risa Sakurai, Yamanashi (JP); Shin-ichiro Endo, Yamanashi (JP); Kazuo Kido, Yamanashi (JP)

(73) Assignee: Panasonic Corporation, Osaka (JP)

( * ) Notice: Subject to any disclaimer, the term of this patent is extended or adjusted under 35 U.S.C. 154(b) by 1063 days.

(21) Appl. No.: 10/582,779

(22) PCT Filed: Dec. 15, 2004

(86) PCT No.: PCT/JP2004/018705

§ 371 (c)(1),
(2), (4) Date: Jan. 19, 2007

(87) PCT Pub. No.: WO2005/061188

PCT Pub. Date: Jul. 7, 2005

(65) Prior Publication Data

US 2007/0289125 A1 Dec. 20, 2007

(30) Foreign Application Priority Data

Dec. 19, 2003 (JP) ............... 2003-422209

(51) Int. Cl.
*H05K 13/04* (2006.01)
(52) U.S. Cl. ............................ 29/743; 294/64.1
(58) Field of Classification Search ................ 29/743; 294/64.1
See application file for complete search history.

(56) References Cited

U.S. PATENT DOCUMENTS 4,794,689 A * 1/1989 Seno et al. ............... 29/740

2003/0029029 A1 2/2003 Ulrich

FOREIGN PATENT DOCUMENTS

| CN | 1330399 | 1/2002 |
|---|---|---|
| DE | 24 29 421 | 9/1975 |
| EP | 0 257 546 | 3/1988 |
| EP | 0 456 426 | 11/1991 |
| JP | 4-3500 | 1/1992 |
| JP | 5-251544 | 9/1993 |
| JP | 5-275513 | 10/1993 |
| JP | 10-154899 | 6/1998 |
| JP | 10173394 A * | 6/1998 |
| JP | 2000-21963 | 1/2000 |

(Continued)

OTHER PUBLICATIONS

Machine Translation of JP10173394A, obtained Jul. 30, 2010.*

(Continued)

*Primary Examiner*—A. Dexter Tugbang
*Assistant Examiner*—Livius R Cazan
(74) *Attorney, Agent, or Firm*—Wenderoth, Lind & Ponack, L.L.P.

(57) ABSTRACT

A suction-and-holding face for a component in a suction nozzle is formed from a semiconductor ceramic so that the suction-and-holding face to be brought into direct contact with the component in suction and holding has the characteristics of a semiconductor. Thus, detrimental effects due to static electricity on the suction nozzle as well as detrimental effects due to electrical conduction between the suction nozzle and the component can be prevented from occurring.

8 Claims, 14 Drawing Sheets

FOREIGN PATENT DOCUMENTS

| | | |
|---|---|---|
| JP | 2000-151200 | 5/2000 |
| JP | 2001-310286 | 11/2001 |
| JP | 2002-233983 | 8/2002 |
| JP | 2002-307359 | 10/2002 |
| JP | 2002307359 A * | 10/2002 |
| JP | 2003127082 A * | 5/2003 |
| WO | 98/33368 | 7/1998 |
| WO | 99/46199 | 9/1999 |

OTHER PUBLICATIONS

Supplementary European Search Report (in English language) issued Nov. 9, 2007.

* cited by examiner

COMPONENT MOUNTING HEAD

TECHNICAL FIELD

The present invention relates to a component mounting head, a suction nozzle and a suction nozzle manufacturing method for mounting a component onto a board by sucking and holding the component by a suction nozzle, placing the component at a component mounting position on the board, and releasing the suction and holding.

BACKGROUND ART

Conventionally, in such a component mounting apparatus equipped with a component mounting head having a suction nozzle, the component mounting head is moved relative to a component to be mounted onto the board so that the suction nozzle is located above the component. Thereafter, the suction nozzle is lowered so that the component is brought into contact with a sucking-and-holding surface of the suction nozzle, and moreover the component is sucked up by the sucking-and-holding surface so that sucking and holding of the component by the suction nozzle can be achieved. Furthermore, the component mounting head, which is equipped with the suction nozzle having the component sucked and held as described above, is moved to a position above the board, and thereafter the suction nozzle is lowered so that the component is located at the component mounting position on the board, and the suction of the suction nozzle is then stopped to release the suction. Thus, the component can be mounted onto the board.

In recent years, electronic equipment containing electronic circuits formed by the mounting of components on a board has been advanced increasingly toward higher functions, more diversifications or smaller sizes. Together with such advancement for higher functions, more diversifications or smaller sizes in electronic equipment, the component and the board themselves also have been advanced toward higher functions, more diversifications or smaller sizes. Also, various conditions required in the mounting of components onto the board are becoming more diversified and wider in variety, while those conditions themselves are becoming more strict.

Such conditions required for the component mounting as described above are, for example, that diversified and variously shaped components can be sucked and held reliably by the sucking-and-holding surface of the suction nozzle, preventing damage to a component that has become more vulnerable to external loads as a result of the higher functionality, or the like. The external loads mentioned above are exemplified by electrical loads such as static electricity or the like, influences of contamination caused by the degree of cleanliness of ambient environments or others, and the like. In some cases, it is required, as another condition, that the suction nozzle or the component mounting head has durability so as to be ready for repeated component mounting operations.

For use as the suction nozzle to be fitted to the component mounting head, various kinds of suction nozzles have been developed so as to meet the various conditions as described above.

Such various kinds of suction nozzles in the prior art include, for example, a suction nozzle formed from a ceramic material (see, e.g., Japanese unexamined patent publication No. 2000-151200 A). Such a suction nozzle, by virtue of being formed by using ceramics, has an advantage that its durability and wear resistance for repeated use of the suction nozzle can be enhanced.

Another kind of suction nozzle of the prior art is exemplified by a suction nozzle formed with the aim of having the capability of sucking and holding components of various configurations, particularly, of large-size components (see, e.g., Japanese unexamined patent publication No. 2002-233983 A). A schematic sectional view of such a suction nozzle 114 is shown in FIG. 13.

As shown in FIG. 13, the suction nozzle 114 is provided so as to be movable up and down and located inside a hollow-shaft like head body 112 which is fitted to a hollow shaft 111 forming part of the component mounting head. Also, the suction nozzle 114 is equipped with a projecting pin 128 which is held on a through hole 117 within the suction nozzle 114 so as to be movable up and down and biased downward. Further, the suction nozzle 114 has a pad member 122 provided at a downward end of its nozzle body 114a. This pad member 122, having a skirt portion 171 which protrudes in a funnel-like state downward on the outer circumferential side, is made from a soft elastic material.

Further, in the suction nozzle 114, a suction face for sucking a component is formed at its downward end face. On this suction face, a sucking-and-holding portion 125 formed of a rigid body in a generally annular shape integrally with the nozzle body 114a so as to protrude downward around a suction port 181 which opens at the end face of the nozzle body 114a. In addition, the skirt portion 171 of the pad member 122 is formed in such placement as to protrude in a funnel shape slightly downward of the sucking-and-holding portion 125. Also, about 15 µm diamond particles are electrodeposited on a surface of the sucking-and-holding portion 125. It is noted that the suction nozzle 114 is formed from a metal material in consideration of its mechanical strength, simplicity of manufacturing process and the like. The suction face in suction and holding of the component has its skirt portion 171 stretched on the surface of the component while the sucking-and-holding portion 125 is kept in contact with the surface of the component.

Next, in the component mounting head having the construction described above, operations in performing suction and holding of the component by the suction nozzle 114 are described with reference to FIGS. 14A, 14B and 14C.

As shown in FIG. 14A, in the component mounting head, in its normal state, the suction face of the pad member 122 keeps a normal state that it is out of contact with the component, i.e. a state that the skirt portion 171 is projected by its own elasticity slightly downward of the sucking-and-holding portion 125. Also, the projecting pin 128 keeps a state that it is projected by biasing force from the suction port 181 to a specified length, and the suction nozzle 114 is kept at a lower-limit position. In this state, as shown in FIG. 14B, the component mounting head lowers toward the surface of the component 109 within the component feed device 104. Then, when the suction face is pressed against the surface of the component 109, the skirt portion 171 is pushed and expanded outward after the inclination of the component 109 even if the component 109 is inclined, so that the sealability between the suction face and the surface of the component 109 can be enhanced. In this state, operating a vacuum generator causes the component 109 to be held on the sucking-and-holding portion 125 by its suction force.

The component mounting head that has sucked the component 109 as described above, after being located on a specified mounting position of the board 103 as shown in FIG. 14C, moves down to mount the component 109 onto the board 103.

With use of the component mounting head having the suction nozzle 114 as described above, it becomes implementable to reliably suck and hold a large-size component, thus enabling component mounting of such large-size components.

DISCLOSURE OF INVENTION

Problems to be Solved by the Invention

However, with such a suction nozzle formed from a ceramic material as described in Japanese unexamined patent publication No. 2000-151200 A, since the ceramic material is commonly an electrically insulating material, static electricity is more likely to occur to the suction nozzle body, causing a possibility that deposition of dust and dirt or the like may be induced by the static electricity so that the suction nozzle itself or the sucked-and-held component may be contaminated. Further, by such static electricity being transferred and added to the component during the sucking and holding operation, the component that has been sucked and held or the component that has been brought into contact with the suction nozzle may be broken. In such a case, there are problems that not only reliable and stable suction and holding of the component can no longer be fulfilled, but also the held component may be contaminated or broken.

Also, as in the case of the suction nozzle 114 described in Japanese unexamined patent publication No. 2002-233983 A, in which the suction nozzle is formed not from electrically insulating material but from electrically conductive material, there is a fear that conduction occurs between the component sucked and held by the suction nozzle 114 and the suction nozzle 114 itself. In such a case, there is a danger that the component may be broken. Particularly when the component is weakened to electrical load as a result of higher functions of the component, this issue becomes more considerable.

Furthermore, the suction nozzle 114, with a view to meeting diversification of components, particularly to sucking and holding of large-size components such as QFPs, includes a pad member 122 that is formed from a soft elastic body. However, due to the arrangement that a tip end of the skirt portion 171 in the pad member 122 is located below the suction face of the suction nozzle 114, for example, when the component to be sucked and held has a small surface for suction and holding but is so sized as to extend to the site of the pad member 122 as a whole of the component, the pad member 122 is brought into contact with the component faster than the suction face and thereafter the skirt portion 171 is pressed against the component so as to be elastically deformed. As a result, although the suction face is brought into contact with the component, yet the elastically deformed state of the skirt portion 171 causes a force to act to make the suction face and the component, which are in contact with each other, separated from each other, so that not enough suction and holding force by the suction face can be obtained in some cases. In such a case, there is a problem that it may be impossible to flexibly implement suction and holding of diversified components having various configurations.

Accordingly, an object of the present invention, lying in solving the above-described problems, is to provide a component mounting head, a suction nozzle and a suction nozzle manufacturing method which are capable of reliably and smoothly implementing suction and holding of highly functionalized, diversified components in component mounting operation for sucking and holding a component by the suction nozzle, placing the component onto a component mounting position on a board and releasing the suction and holding to achieve the mounting of the component onto the board.

More specifically, the present invention is purposed:

(1) To provide a suction nozzle and a component mounting head which are kept from giving any external load on the component in the suction and holding; and (2) To provide a suction nozzle and a component mounting head which are capable of reliably and flexibly implementing suction and holding of diversified, various-in-configuration components.

Means for Solving the Problems

In order to achieve the above objects, the present invention has the following constitutions.

According to a first aspect of the present invention, there is provided a component mounting head which includes a suction nozzle having a suction-and-holding face for a component, and in which a component is sucked and held by the suction-and-holding face of the suction nozzle and the sucked-and-held component is placed at a component mounting position on a board while the suction and holding of the component is released, by which the component is mounted onto the component mounting position, wherein a portion of the suction nozzle having the suction-and-holding face is formed from a semiconductor ceramic.

According to a second aspect of the present invention, there is provided the component mounting head as defined in the first aspect, wherein the semiconductor ceramic has a volume resistivity value within a range of $10^4$ to $10^8$ $\Omega\cdot$cm.

According to a third aspect of the present invention, there is provided the component mounting head as defined in the second aspect, wherein in the suction nozzle, a suction hole portion which is integrally formed of a generally circular-shaped hole portion formed with an axial center of the suction nozzle taken as its center, and a plurality of end-portion extended portions that end portions of the circular-shaped hole portion are partly extended in its radial direction and which serves to suck up the component being in contact therewith is formed in the suction-and-holding face.

According to a fourth aspect of the present invention, there is provided the component mounting head as defined in the third aspect, wherein the suction nozzle comprises:

a projecting member which is inserted and placed within the generally circular-shaped hole portion so as to be slidable between an accommodated position, where a tip end portion of the projecting nozzle is positioned inner than the suction-and-holding face, and a projective position, where the tip end portion is projected from the suction-and-holding face; and a biasing member for normally biasing the projecting member toward the projective position.

According to a fifth aspect of the present invention, there is provided the component mounting head as defined in the fourth aspect, wherein the tip end portion of the projecting member is formed from the semiconductor ceramic.

According to a sixth aspect of the present invention, there is provided the component mounting head as defined in the third aspect, wherein the suction-and-holding face of the suction nozzle is surface finished so as to have a multiplicity of depressed/projected portions having heights or depths of about 10 to 20 μm.

According to a seventh aspect of the present invention, there is provided the component mounting head as defined in the sixth aspect, wherein the multiplicity of depressed/projected portions are recess portions which are formed in the suction-and-holding face so as to make the suction hole portion and an outer circumferential end portion of the suction-and-holding face communicated with each other.

According to an eighth aspect of the present invention, there is provided the component mounting head as defined in the first aspect, further including an auxiliary suction member which is formed from an elastic material and which has an inner circumferential end portion placed in close contact with an outer circumferential portion of the suction nozzle, and an outer circumferential end portion formed so as to project outward of a circumferential portion of the suction-and-holding face and placed at a position generally equal in height to the suction-and-holding face or slightly backward of the suction-and-holding face.

According to a ninth aspect of the present invention, there is provided the component mounting head as defined in the eighth aspect, wherein the suction nozzle includes an auxiliary suction member fitting portion which is set at an outer circumferential portion thereof so that the inner circumferential end portion of the auxiliary suction member is attached thereto detachably therefrom, and the auxiliary suction member is selectively attached to the auxiliary suction member fitting portion depending on size of the component to be sucked and held.

According to a tenth aspect of the present invention, there is provided a suction nozzle included in a component mounting head for sucking and holding a component and placing the sucked-and-held component to a component mounting position in a board and releasing the suction and holding of the component to mount the component onto the component mounting position, wherein a portion of the suction nozzle having a suction-and-holding face for releasably sucking and holding the component is formed from a semiconductor ceramic.

According to an eleventh aspect of the present invention, there is provided a method for manufacturing a suction nozzle included in a component mounting head for sucking and holding a component and placing the sucked-and-held component to a component mounting position in a board and releasing the suction and holding of the component to mount the component onto the component mounting position, the method comprising:

with use of a metal mold in which numerous hard particles are fixed at a portion corresponding to the component suction-and-holding face in the suction nozzle, molding the suction nozzle by injecting a semiconductor ceramic into the metal mold so that a multiplicity of depressed/projected portions corresponding to the individual hard particles are formed in the suction-and-holding face.

According to a twelfth aspect of the present invention, there is provided the method for manufacturing a suction nozzle as defined in the eleventh aspect, wherein the metal mold is formed by electrodepositing the hard particles containing diamond particles having diameters of about 10 to 20 μm at sites corresponding to the suction-and-holding face, and the depressed/projected portions formed in the suction-and-holding face have heights or depths of about 10 to 20 μm.

EFFECTS OF THE INVENTION

According to the first aspect of the invention, in the component mounting head, since the suction nozzle is formed not from ceramics having electrical insulation property (see, e.g., Japanese unexamined patent publication No. 2000-151200 A) but from, for example, a semiconductor ceramic made by mixing of carbon particles and ceramics or the like, the suction nozzle formed as such can be made to have characteristics as semiconductor. As a result of this, occurrence of static electricity in the suction nozzle (as in the case where it is formed from an insulative material) can be prevented, making it possible to reliably prevent the possibilities of contamination of the component due to deposition of dust and dirt or the like caused by the occurrence of the static electricity, as well as electrical damage of the component due to transfer and impartment of the static electricity to the component being in contact with the suction nozzle. Also, by virtue of the suction nozzle not having characteristics as electrical conductivity but having characteristics as semiconductor, there is no electrical conduction to the component being in contact with the suction nozzle, electrical damage of the sucked-and-held component due to the conduction can reliably be prevented. Accordingly, there can be provided a suction nozzle and a component mounting head capable of reliably and stably fulfilling the suction and holding as well as mounting of components that have been advanced to higher functions, higher precision and more diversification.

According to the second aspect of the invention, with the use of a semiconductor ceramic as described above, when its volume resistivity value is set within a range of $10^4$ to $10^8$ Ω·cm, the characteristics as semiconductor can be obtained reliably.

According to the third aspect of the invention, since the suction hole portion formed in the suction nozzle is integrally formed of a generally circular-shaped hole portion and a plurality of end-portion extended portions resulting from partly extending end portions of the circular-shaped hole portion from the end portions along the radial direction of the generally circular-shaped hole portion, suction and holding of larger-size components can stably be fulfilled. Also, in suction and holding of a small-size component, even if it is held in an oblique-suction posture, the possibility of occurrence of an event that the sucked-and-held component may fit and enter into the suction hole portion can be reduced to a large extent. Thus, it becomes possible to reliably and stably suction and hold various components ranging from small-size components to large-size components and further to special-shape components.

According to the fourth aspect of the invention, even in the case where the projecting member that slides along the suction hole portion of the suction nozzle is provided, since the projecting member slides within the generally circular-shaped hole portion and the projecting member is not placed at each of the elongate holes, the possibility of occurrence of an event that the projecting member is inhibited from sliding due to the suction of dust and dirt or the like through the suction hole portion can be reduced to a large extent. Accordingly, it becomes implementable to fulfill stable operation of the projecting member.

Also, the provision of the projecting member as described above makes it possible to aid the suction operation in the suction nozzle as well as to aid the suction-and-holding release operation of the sucked-and-held component. Accordingly, it becomes possible to reliably and stably perform the suction-and-holding operation and the mounting operation.

According to the fifth aspect of the invention, since the projecting member is formed from the semiconductor ceramic, the same effects as in the case where the suction nozzle is formed from the semiconductor ceramic can be obtained.

According to the sixth aspect of the invention, the suction nozzle is surface finished so that a multiplicity of depressed/projected portions having heights or depths of about 10 to 20 μm are formed in the suction-and-holding face to be brought into contact with the component. Therefore, in the suction and holding of the component, occurrence of slides between the component and the suction-and-holding face can be reduced, making it possible to fulfill reliable, stable suction and holding. Also, by virtue of the formation of the depressed/projected portions in the suction-and-holding face as described above, when an image of a state that the component is sucked and held is captured from below the suction nozzle, light applied to the suction-and-holding face can be diffusely reflected by the depressed/projected portions, so that the component image can reliably be captured. Accordingly, while a component of diversified various configurations is sucked and held, its sucking-and-holding posture can correctly be recognized, making it possible to fulfill component mounting with high precision.

According to the seventh aspect of the invention, since the depressed/projected portions are recess portions which are formed in the suction-and-holding face so as to make the suction hole portion and an outer circumferential end portion of the suction-and-holding face communicated with each other, partial gaps can positively be formed between the component and the suction-and-holding face in their contact state. By virtue of such formation of the gaps, a fluid (e.g., air) rapidly flows through minute spaces between these gaps (recess portions) by the negative-pressure suction action of the suction hole portion, so that a negative pressure can be generated in the gaps between the component and the suction-and-holding face according to Bernoulli's principle (gap negative-pressure effect). In addition to the negative pressure by the suction of the suction hole portion (e.g., vacuum-source negative-pressure effect), the gap negative-pressure effect can also be used, so that component holding can reliably be fulfilled with larger suction force.

According to the eighth aspect of the invention, since an auxiliary suction member is further included in the suction nozzle, an outer circumferential end portion of the auxiliary suction member can aid the suction and holding of the component by the suction-and-holding face.

In particular, by virtue of the formation that the outer circumferential end portion is positioned generally equal in height to the suction-and-holding face, or slightly backward thereof, in the suction and holding of the component by the suction nozzle, there can reliably be prevented occurrence of an event that the tip end portion of the outer circumferential end portion comes into contact with the component earlier than the suction-and-holding face, inhibiting the suction and holding of the component by the suction-and-holding face. Such an event that the suction and holding is inhibited can occur in the case of the formation that the outer circumferential end portion is positioned at such a height position as to project from the suction-and-holding face.

Also, the outer circumferential end portion is formed from an elastically deformable elastic material, and while the outer circumferential end portion is kept close to the top portion of the component, the outer circumferential end portion can be elastically deformed inwardly downward as the internal pressure of the space sandwiched by the outer circumferential end portion and the top portion of the component is decreased. By such elastic deformation, the outer circumferential end portion can reliably be brought into contact with the top portion of the component. Accordingly, reliable suction and holding of the component can be achieved by the auxiliary suction member. Such suction and holding being implementable, the region in the suction nozzle where the suction and holding can be carried out can be expanded up to a region surrounded by the outer circumferential end portion of the auxiliary suction member, thus making it possible to fulfill the suction and holding of large-size components and special-shape components. Further, for small-size components that are almost free from contact with the outer circumferential end portion, bringing the suction-and-holding face into contact with the component makes it possible to achieve reliable suction and holding regardless of the presence or absence of the auxiliary suction member. Thus, it becomes possible to perform the suction and holding of diversified components of various configurations ranging from small-size components to large-size components and further to special-shape components, flexibly and promptly.

According to the ninth aspect of the invention, the auxiliary suction member can be attached thereto and detached therefrom, depending on the size of the component to be sucked and held. Therefore, depending on cases where the component is a small-size component or a large-size component or the like, the auxiliary suction member can be selectively loaded.

According to the tenth aspect of the invention, there can be provided a suction nozzle capable of obtaining the same effects as in the first aspect.

According to the eleventh and twelfth aspects of the invention, for the formation of the depressed/projected portions in the suction-and-holding face of the suction nozzle, taking into account that the suction nozzle is formed from a semiconductor ceramic, performing shot blasting on the ceramic as in, for example, Japanese unexamined patent publication No. 2000-151200 A to form the depressed/projected portions would cause occurrence of cracks or instability of the processed surface, posing problems such as higher possibilities of occurrence of sagging at end portions and further elongated processing time. Besides, performing the electrodeposition of diamond particles on the suction nozzle to form the depressed/projected portions as in Japanese unexamined patent publication No. 2002-233983 A, although implementable when the suction nozzle is formed from a metal material or the like, is impossible when the suction nozzle is formed from ceramics, disadvantageously.

In order to solve these and other problems, fixing hard particles, for example, electrodepositing diamond particles having diameters of about 10 to 20 μm, on the metal mold itself and molding the suction nozzle from the semiconductor ceramic by using this metal mold makes it possible to form the depressed/projected portions in the suction-and-holding face, reliably and simply.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Hereinbelow, an embodiment of the present invention will be described in detail with reference to the accompanying drawings.

Figure 1:
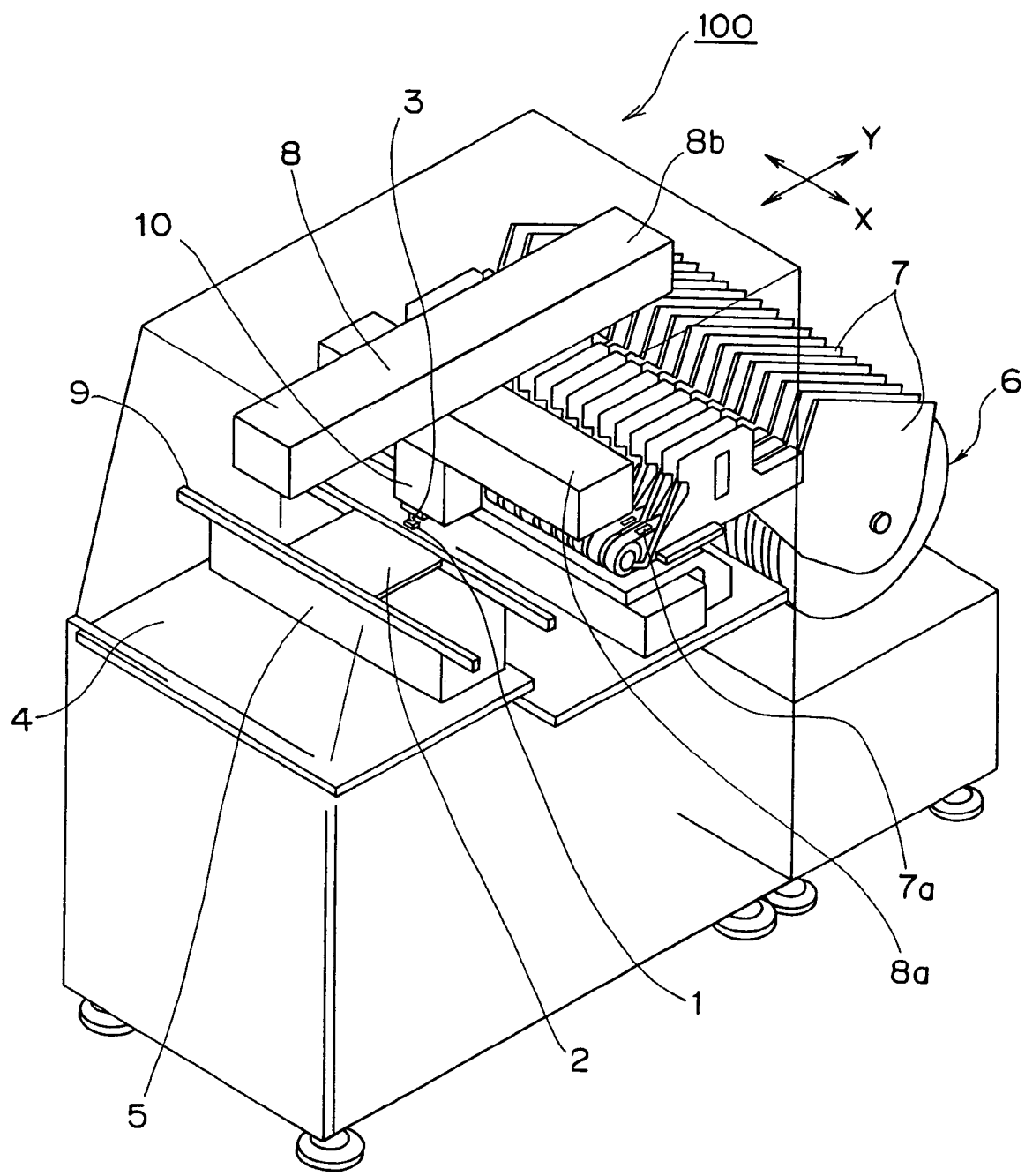
FIG. 1 is an appearance perspective view of a component mounting apparatus including a component mounting head according to an embodiment of the present invention.

FIG. 1 is a schematic perspective view showing a schematic construction of a component mounting apparatus 100 including a component mounting head 10 according to an embodiment of the present invention.

As shown in FIG. 1, the component mounting apparatus 100 includes a component feed unit 6 which is an example of a component feed device for extractably feeding a plurality of components 1, a stage 5 which is an example of a board holding device for releasably holding a board 2 to which the fed components 1 are to be mounted, a component mounting head 10 for holding and extracting each of the components 1 extractably fed from the component feed unit 6 and for performing the mounting of the held component 1 onto the board 2 held by the stage 5, and an XY robot 8 which is an example of a head moving unit for performing moving operation of the component mounting head 10 generally along a surface of the board 2.

Also, as shown in FIG. 1, a suction nozzle 3 which is an example of a component holding member for releasably sucking and holding the component 1 at its top face is provided on a lower face of the component mounting head 10.

The suction nozzle 3 is enabled to move up and down generally along a direction perpendicular to the surface of the board 2.

Also, as shown in FIG. 1, the XY robot 8 includes an X-axis robot 8a which supports the component mounting head 10 and further which moves back and forth the component mounting head 10 in an X-axis direction in the figure, and a Y-axis robot 8b which supports the X-axis robot 8a and further which moves back and forth the X-axis robot 8a along a Y-axis direction in the figure. As a result of this, the component mounting head 10, i.e., the suction nozzle 3 included in the component mounting head 10 can be moved along the X-axis direction or Y-axis direction in the figure. It is noted that the X-axis direction and the Y-axis direction in the figure are generally parallel to the surface of the board 2 and perpendicular to each other.

Also, the component feed unit 6 has a plurality of component feed cassettes 7 which have so-called taped components, i.e. a plurality of components 1 extractably accommodated on a carrier tape, and moreover which move and feed the accommodated taped components to set the housed components 1 extractable, where the component feed cassettes 7 are adjacent to one another along the X-axis direction in the figure. Further, the individual component feed cassettes 7 have component extraction positions 7a where the components 1 to be set into the extractable state should be positioned are so placed as to be arrayed in line along X-axis direction. It is noted that although the present embodiment has been described in a configuration in which the component feed unit 6 feeds the taped components from the component feed cassettes 7, the embodiment is not limited to such configurations. Instead, for example, the case may be that component feed trays are provided in the component feed unit 6 to allow the feeding of relatively large-sized components such as QFPs or large-sized and specially-shaped components such as connector components.

Also, the stage 5 is placed on a machine base 4 of the component mounting apparatus 100. At an upper portion of the stage 5 is provided a board conveyance unit 9 for conveying and feeding the board 2 from the right side in the X-axis direction in the figure to the stage 5 and for conveying and discharging the board 2 to the left side in the X-axis direction in the figure from the stage 5.

The component mounting apparatus 100 further has a control system (not shown) for controlling individual operations of individual constructional parts of the component mounting apparatus 100 including the head section, the component feed unit 6, the XY robot 8, the board conveyance unit 9 or the like in association of their respective operations with one another.

Figure 2:
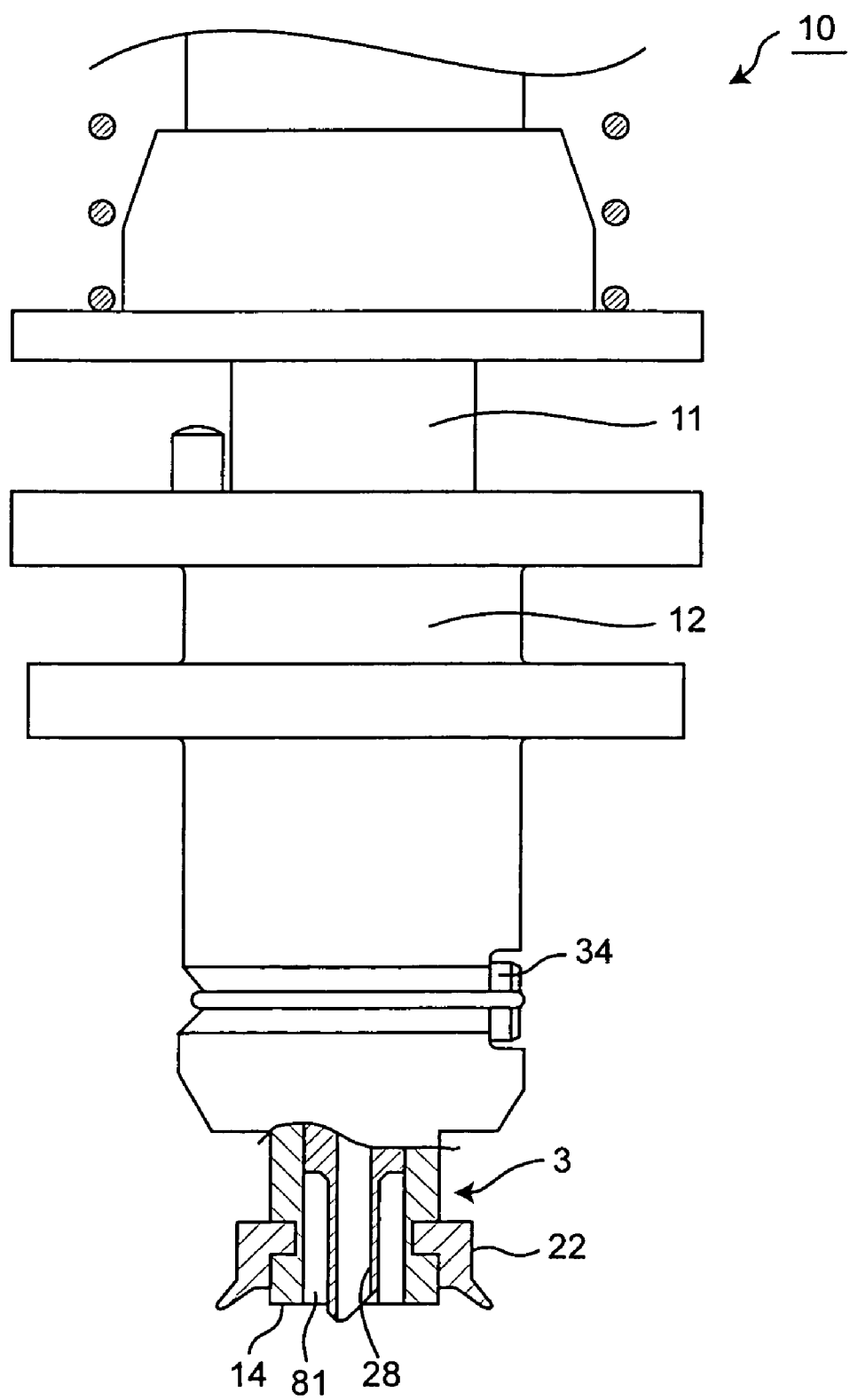
FIG. 2 includes a lower-part side view of the component mounting head and a partial longitudinal sectional view of a suction nozzle fitted thereto, showing a state that a pad member and a projecting nozzle are included therein.
Figure 3:
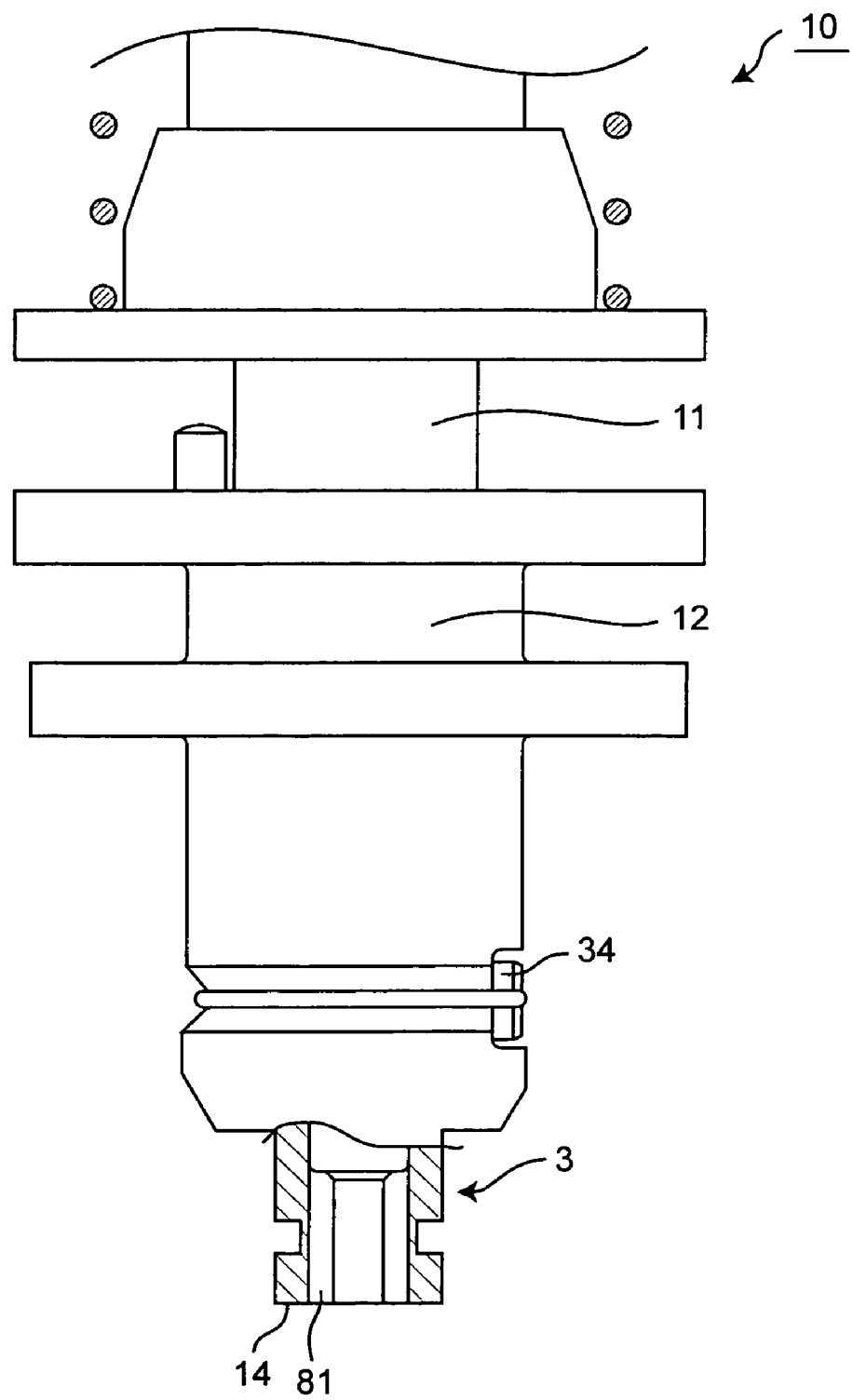
FIG. 3 includes a lower-part side view of the component mounting head and a partial longitudinal sectional view of a suction nozzle fitted thereto, showing a state that a pad member and a projecting nozzle have been removed therefrom.
Figure 4:
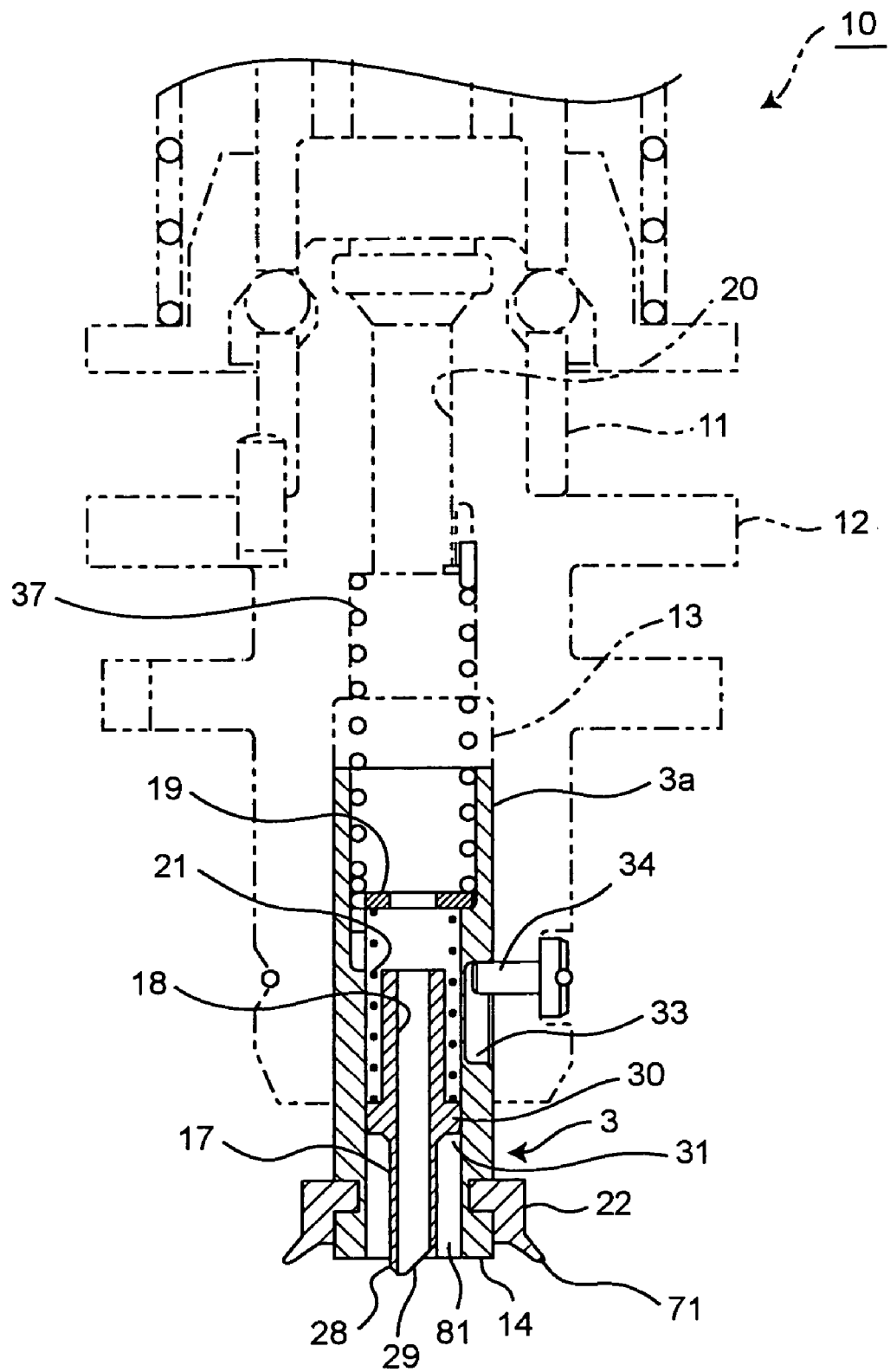
FIG. 4 includes a lower-part side perspective view of the component mounting head and an overall longitudinal sectional view of a suction nozzle fitted thereto, showing a state that a pad member and a projecting nozzle are fitted therein.
Figure 5:
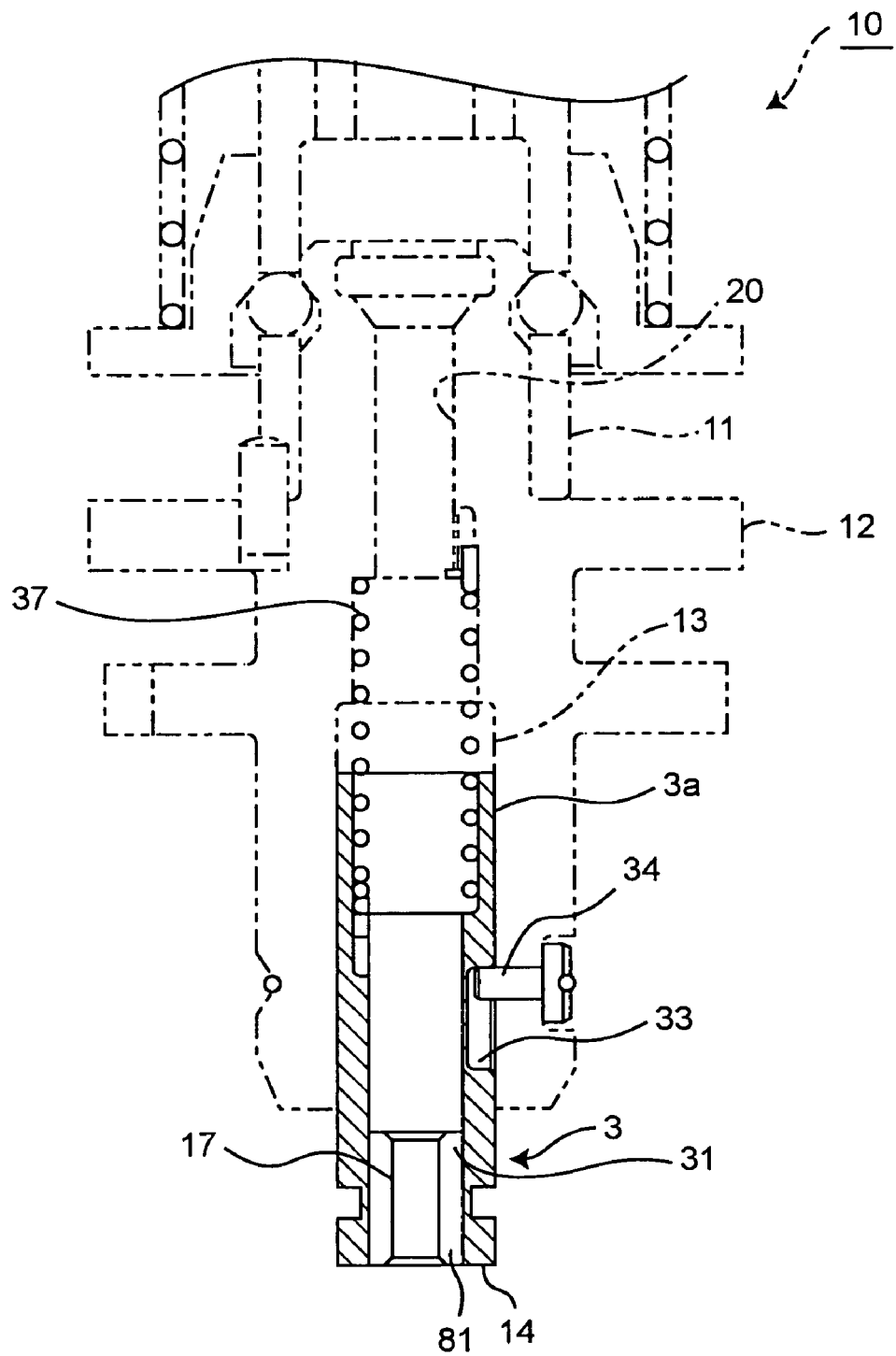
FIG. 5 includes a lower-part side perspective view of the component mounting head and an overall longitudinal sectional view of a suction nozzle fitted thereto, showing a state that a pad member and a projecting nozzle have been removed therefrom.
Figure 6:
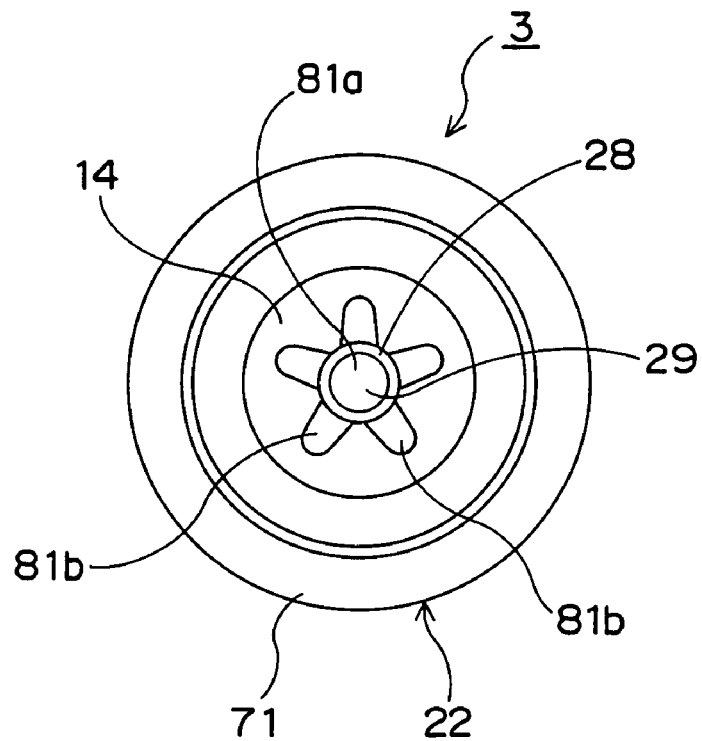
FIG. 6 is a bottom view of the suction nozzle of FIG. 4 as viewed from below.
Figure 7:
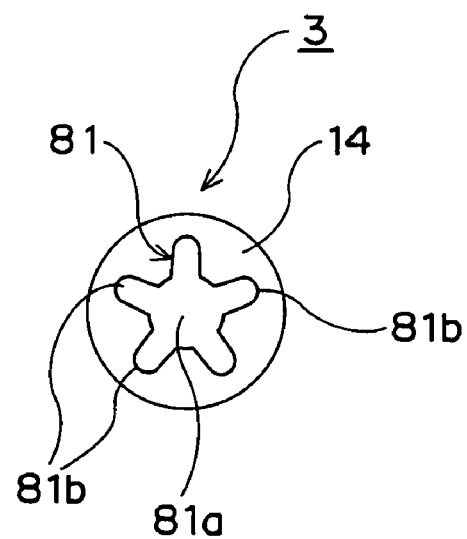
FIG. 7 is a bottom view of the suction nozzle of FIG. 5 as viewed from below.

Next, construction of the component mounting apparatus 100, particularly of the suction nozzle 3 included in the component mounting head 10, in such a component mounting apparatus 100 as described above is explained in detail. As schematic constructional views showing a schematic construction of such a component mounting head 10, FIGS. 2 and 3 show a lower-part side view of the component mounting head 10 and a partial longitudinal sectional view of the suction nozzle 3. Further, FIGS. 4 and 5 show overall longitudinal sectional views of the suction nozzle 3 as seen through the lower part of the component mounting head in FIGS. 2 and 3. It is noted that FIGS. 2 and 4 show a state that later-described pad member and projecting nozzle are fitted to the suction nozzle 3, while FIGS. 3 and 5 are show a state that the pad member and the projecting nozzle have been removed from the suction nozzle 3. Also, a sucking-and-holding face, which is the lower face of the suction nozzle 3 in FIGS. 2 and 4, is shown in FIG. 6, and the sucking-and-holding face of the suction nozzle 3 in FIGS. 3 and 5 is shown in FIG. 7. Hereinbelow, construction of the suction nozzle 3 is explained by referring to FIGS. 2 to 7, particularly and mainly by referring to FIG. 4 that allows a clear understanding of the relationship between the internal structure of the suction nozzle 3 and the internal structure of the component mounting head 10.

As shown in FIGS. 2 to 5, particularly in FIG. 4, the component mounting head 10 includes a hollow shaft-shaped head body 12 which is fitted to a hollow shaft 11 connected on the vacuum generator (not shown) side and which has a small-diameter retainer hole 20 and a large-diameter retainer hole 13 formed at its central portion, a suction nozzle 3 which is placed on the large-diameter retainer hole 13 of the head body 12 so as to be movable up and down, a projecting nozzle 28 (an example of a projecting member) which is held on the base 17 within the suction nozzle 3 so as to be up-and-down movable and downwardly biased, and a coil spring 37 which is placed between the head body 12 and the suction nozzle 3 and which biases the suction nozzle 3 downward at all times. The suction nozzle 3 has a pad member 22 (auxiliary suction member) fitted at a downward end of a nozzle body 3a of the nozzle 3. The pad member 22, having a skirt portion 71 (an example of an outer circumferential end portion) which protrudes in a funnel-like state downward on the outer circumferential side, is made from elastic material, more preferably from soft elastic material.

Further, in the suction nozzle 3, a suction face 14 which is an example of the sucking-and-holding face for sucking and holding a component is formed at its downward end face. This suction face 14 is formed as a generally annular plane around a suction port 81, which is an example of a suction hole portion opening at the end face of the nozzle body 3. In addition, the surface of the suction face 14 is surface finished so that minute depressions and projections having about 10 to 20 µm, e.g. about 15 µm heights or depths, are formed.

Also, the projecting nozzle 28 has a suction hole 18 formed so as to extend through its axial center along the axial direction, and also has a inclined suction hole 29 formed in a inclined state at its lower end portion. Further at a side peripheral portion near a generally intermediate height position of the projecting nozzle 28, a projectively swollen engagement portion 30 is formed so as to extend around. This engagement portion 30 is normally biased downward by a projecting-nozzle use compression spring 21, which is an example of a biasing member (elastic material), so as to be normally pressed against an engagement step portion 31 provided within a through hole 17 of the suction nozzle 3. In such a state, the tip end portion of the projecting nozzle 28 is projected from the suction port 81 by a specified length. It is noted that a top end of the projecting-nozzle use compression spring 21 is fixed to a spring washer 19 placed inside the suction nozzle 3, and this spring washer 19 is normally biased downward with its fitting position restricted by the coil spring 37. Further, with the projecting nozzle 28 fitted in this way, the projecting nozzle 28 can be moved back and forth between a projective position, in which the projecting nozzle 28 is projected, and an accommodated position, in which its tip end portion is stored in the suction port 81 of the suction nozzle 3, by pressing the projecting nozzle 28 against the top face of the component.

Also, the component mounting head 10 has a line of vacuum suction passage formed so as to communicate with the vacuum generator through the suction hole 18 of the projecting nozzle 28, the through hole 17 of the suction nozzle 3, the large-diameter retainer hole 13, the small-diameter retainer hole 20 and the hollow shaft 11 of the head body 12.

In addition, this component mounting head 10 is constructed so as to be able to absorb differences in thickness among components. That is, an axially extending guide recess 33 is formed on one side face of the suction nozzle 3 held on the head body 12 in an up-and-down movable, downwardly biased state, and the tip end position of a guide pin 34 fitted and inserted into the head body 12 is slidably engaged with the guide recess 33. Normally, the suction nozzle 3 is held by the coil spring 37 at a lower-limit position where the guide pin 34 makes contact with a top end portion of the guide recess 33. Further, the coil spring 37 is a torsion coil spring member, which keeps the guide pin 34 normally in contact with one side face of the guide recess 33 by torsional restoring force. The suction nozzle 3, the up-and-down movable range of which is restricted by the guide pin 34 and the guide recess 33, is allowed to enter into the head body 12 from the lower-limit position to an upper-limit position where the guide pin 34 makes contact with the lower end face of the guide recess 33.

Now, configuration and the like of the suction face 14 and the suction port 81 of the suction nozzle 3 are explained in detail with reference to FIGS. 6 and 7.

As shown in FIG. 7 (which is a state that the projecting nozzle 28 and the pad member 22 are not attached to the suction nozzle 3), the suction port 81 of the suction nozzle 3 is formed integrally of a main hole portion 81a which is an example of a generally circular-shaped hole portion formed with the axial center of the suction nozzle 3 taken as a center of the hole portion, and a plurality of end-portion extended portions (i.e. extended hole portions) which extend from end portions of the main hole portion 81a along its radial direction in the suction face 14 to partly extend outer circumferential end portions of the main hole portion 81a, e.g. a plurality of elongate holes 81b which are so formed as to extend radially in five directions at generally equal angular pitches.

Also, in the state shown in FIG. 6 (a state that the projecting nozzle 28 and the pad member 22 have been attached to the suction nozzle 3), the projecting nozzle 28 is attached so as to be housed within the main hole portion 81a in the suction port 81, and the individual elongate holes 81b are placed around the projecting nozzle 28. Further, the skirt portion 71 of the pad member 22 is placed annularly so as to surround the entire outer circumference of the suction face 14 of the suction nozzle 3.

Also, as a dimensional example of the configuration of such a suction port 81, for example, the main hole portion 81a may be provided with a diameter of 1.5 mm, the respective elongate holes 81b may be provided five in number each with a width of 0.6 mm, and further an imaginary circle connecting outer circumferential end portions of the respective elongate holes 81b may be set with a diameter of 3 mm. Furthermore, the outer peripheral circle of the suction face 14 may be provided with a diameter of 5 mm, and the outer circumferential end portion of the skirt portion 71 of the pad member 22 may be provided with a diameter of 8 mm.

Figure 8:
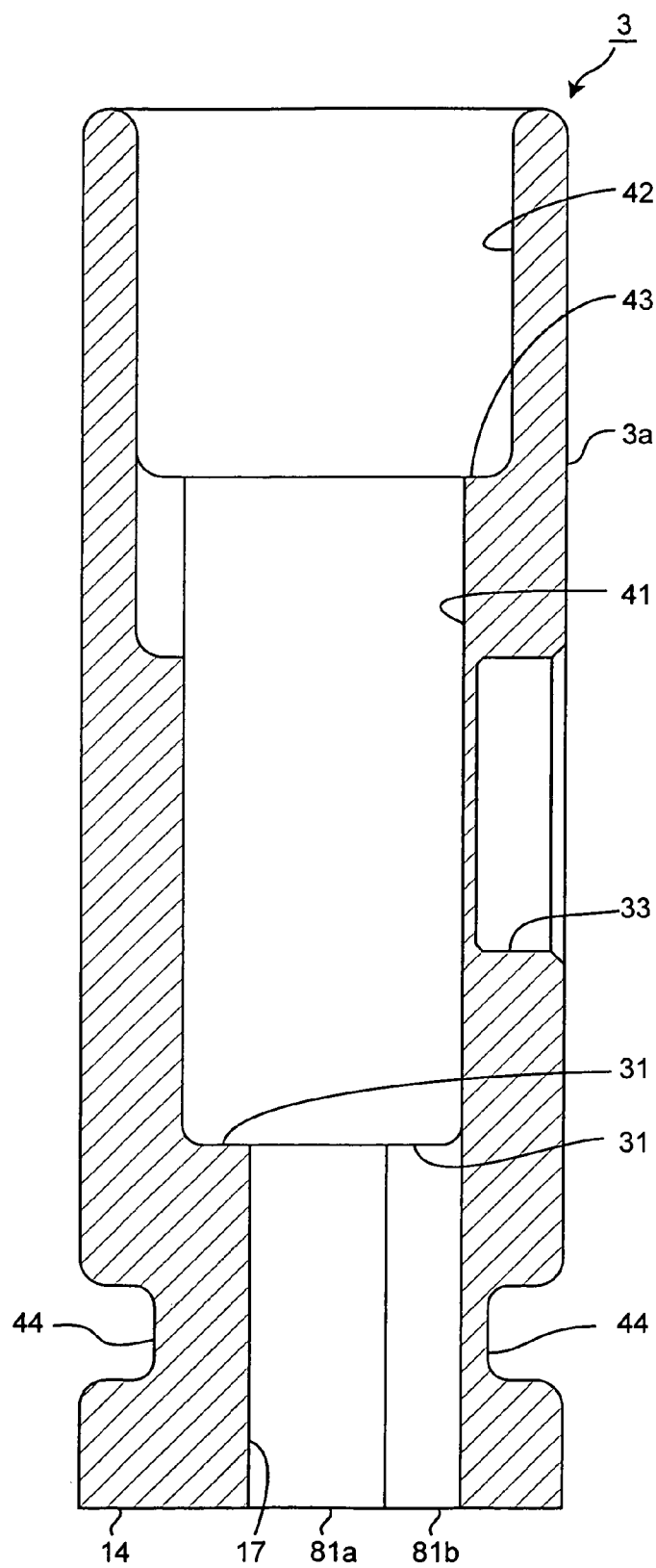
FIG. 8 is a longitudinal sectional view of the suction nozzle body.
Figure 9:
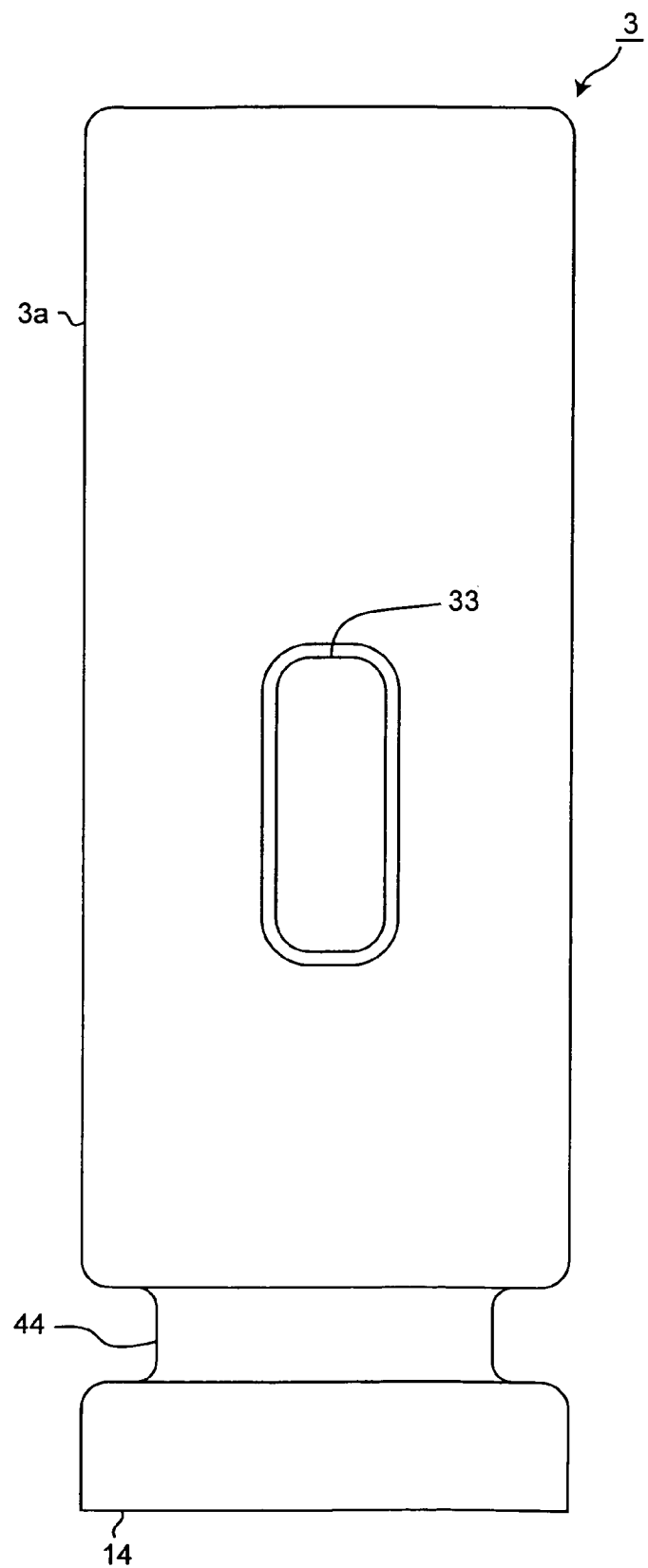
FIG. 9 is a side view of the suction nozzle body.

FIG. 8 shows a longitudinal sectional view of the suction nozzle 3 that has been removed from the component mounting head 10, and FIG. 9 shows an appearance side view thereof.

As shown in FIG. 8, the suction nozzle 3 is so formed as to make up a communication line of the suction port 81 composed of the main hole portion 81a and the plurality of elongate holes 81b formed in the suction face 14, which is the lower end face of the suction port 81, the through hole 17 formed in communication with the suction port 81, an intermediate hole 41 communicated with the through hole 17 at a position where the engagement step portion 31 is formed, and an upper hole 42 which is communicated with the intermediate hole 41 at a position where a spring washer restricting step portion 43 provided for restriction of the placement position of the spring washer 19 is formed, and which is opened in an upper portion of the suction nozzle 3.

Figure 10:
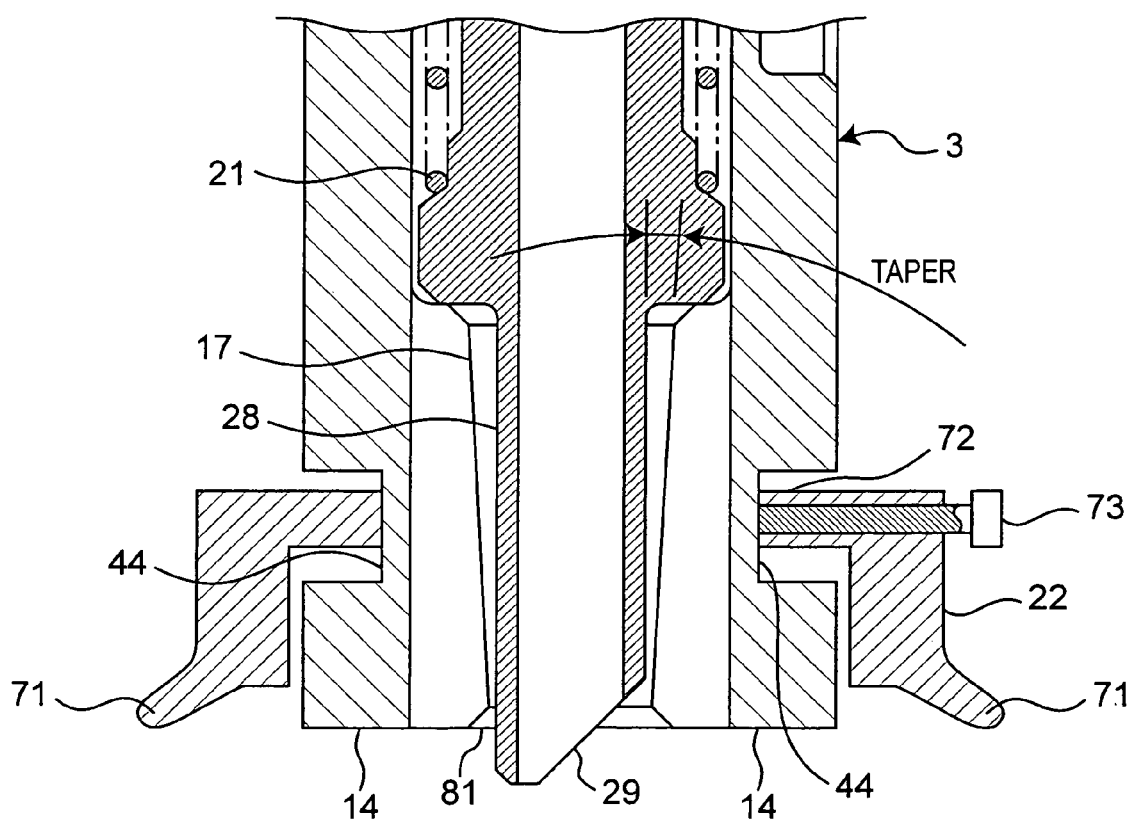
FIG. 10 is an enlarged sectional view of a lower portion of the suction nozzle.

Also, as shown in FIGS. 8 and 9, a fitting recess portion 44 (which is an example of the auxiliary suction member fitting portion) for the pad member 22 is formed in a near-bottom circumferential surface of the suction nozzle 3 so as to surround the circumferential surface. Further, as shown in FIG. 10, which is a partly enlarged sectional view of the suction nozzle 3 with the pad member 22 attached thereto, the fitting recess portion 44 is formed so that an inner circumferential end portion 72 of the pad member 22 is allowed to make contact with the bottom portion of the fitting recess portion 44 formed in the circumferential surface of the suction nozzle 3, and that the fitting height for the pad member 22 is adjustable, its formation width becomes larger than the width of the inner circumferential end portion 72 of the pad member 22. Further, the inner circumferential end portion 72 of the pad member 22 can be fixed to the fitting recess portion 44 at a desired fitting height position by a fixing screw 73. In this way, by the formation of the inner circumferential end portion 72 of the pad member 22 and the fitting recess portion 44 of the suction nozzle 3, it is made possible to fix the tip end height of the skirt portion 71, which is the outer circumferential end portion of the pad member 22, under adjustment based on the relationship of the suction nozzle 3 with the suction face 14. In this embodiment, the tip end height position height of the skirt portion 71 of the pad member 22 is adjusted to either a position generally equal to the height position of the suction face 14 of the suction nozzle 3, or a position slightly movedback position (i.e., a position where the tip position of the skirt portion 71 is positioned slightly upward of the suction face 14).

Also, the suction nozzle 3 according to this embodiment is formed from a semiconductor ceramic. It is noted here that the term, semiconductor ceramic, refers to a ceramic which can generally be formed by mixing carbon or other semiconductor material into an electrically insulative ceramic which has characteristics as semiconductor depending on the mixing ratio of the semiconductor material. In order for the ceramics to have characteristics as semiconductor, it is necessary that their volume resistivity value fall within a range of 1 to about $10^8$ Ω·cm. Desirably, the suction nozzle 3 is formed from a semiconductor ceramic having volume resistivity values within a range of $10^4$ to $10^8$ Ω·cm with a view to secure impartment of characteristics as semiconductor.

As described above, by forming the suction nozzle 3 from semiconductor ceramics, occurrence of static electricity in the suction nozzle 3 can be suppressed. Thus, there can be obtained effects for prevention of contamination of components due to deposition of dust and dirt and for prevention of static electricity application to components in the contact between the suction nozzle 3 and the component. Furthermore, by virtue of the suction nozzle 3 not having electrical conductivity, there can be obtained an effect for preventing the component from undergoing electrical damage due to electrical conduction from the suction nozzle 3 to the component.

Although this embodiment has been described in a configuration in which the entire suction nozzle 3 is formed from a semiconductor ceramic, this embodiment is not limited to such a configuration. Instead of such a case, it is also possible that part of the suction nozzle 3 corresponding to the suction face 14 is formed from a semiconductor ceramic. This is because in this suction nozzle 3, at least the suction face 14, which is the part that makes contact with the component, has the characteristics as semiconductor and therefore the foregoing individual effects can be obtained.

Also, in the case where the projecting nozzle 28 is attached in the suction nozzle 3, the projecting nozzle 28, which is also brought into contact with the component, is desirably formed from a semiconductor ceramic. Likewise, instead of the case where the entire projecting nozzle 28 is formed from a semiconductor ceramic, the case may be that the inclined suction hole 29, which is at least the tip end portion of the projecting nozzle 28, is formed from a semiconductor ceramic.

Also, in the case where the suction nozzle 3 is formed from a semiconductor ceramic as described above, suction nozzle 3 is formed by molding process, for example, by using a metal mold. In this case, as shown in FIG. 10, it is preferable that the through hole 17 of the suction nozzle 3 is tapered so as to slightly extend upward in the figure, where the direction in which the mold is drawn is the upward direction of the figure. Such a taper can fulfill its function enough if the projecting nozzle 28 to be inserted and placed into the through hole 17 of the suction nozzle 3, which becomes necessary for the molding process, is free from occurrence of rattling at the downward tip end portion in the figure.

Also, in the manufacture of the suction nozzle 3 by molding process as described above, by fixing a multiplicity of hard particles to sites of the metal mold corresponding to the suction face 14 of the suction nozzle 3, and by molding the suction nozzle 3 from semiconductor ceramics with the metal mold, the suction nozzle 3 can be surface finished so as to form a multiplicity of depressions and projections corresponding to the respective hard particles on the suction face 14. More specifically, by using diamond particles having particle sizes of about 10 to 20 μm as the hard particles, and by using a metal mold formed by electrodeposition of diamond particles at the aforementioned sites, depressions and projections having heights or depths within a range of about 10 to 20 μm, for example, 15 μm can be formed. It is noted that the hard particles have only to contain at least the deposition processing as its main constituent.

Next, component sucking and holding operations by the component mounting head 10 including the suction nozzle 3 having such a construction as described above are explained with reference to FIGS. 11 and 12.

Figure 11:
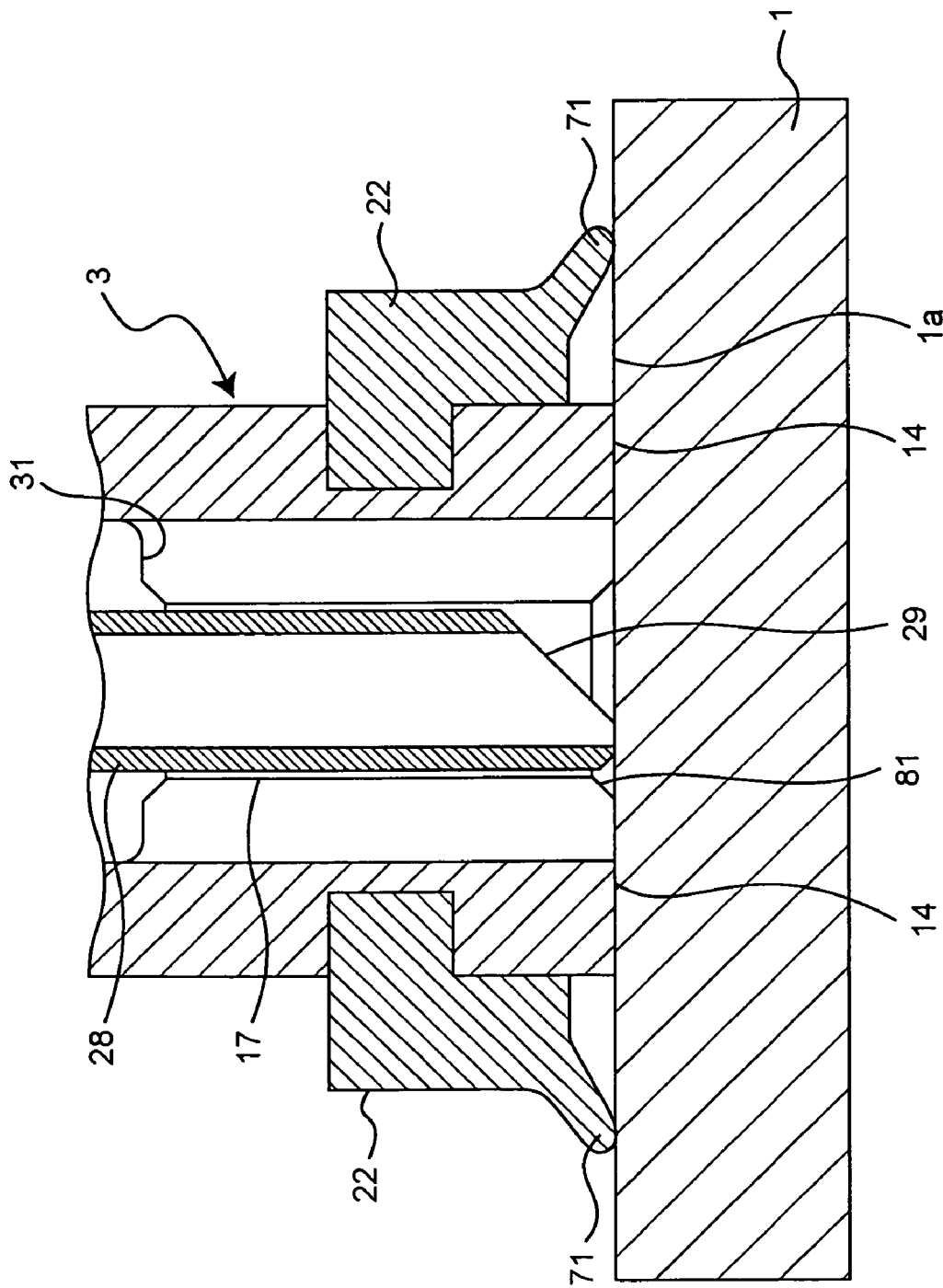
FIG. 11 is a schematic sectional view of the suction nozzle, showing a state that the suction nozzle is sucking and holding a large-size component.

The component mounting head 10 of this embodiment is ready for board mounting of so-called small-size components such as chip components and small-size IC components, electronic components generally referred to as special-shape components such as aluminum electrolytic capacitors (e.g., those having diameters of about 8 to 10 mm and those having about 10 mm-high cylindrical shapes) and connector components (e.g., those having rectangular or other various shapes), and further QFPs or other large-size IC components, and the like. FIG. 11 shows a state that a large-size component like a QFP (e.g., 28 mm square×4 mm thick) among those components is sucked and held not only by the suction face 14 of the suction nozzle but also by the pad member 22.

FIG. 11 shows a state that the components 1 has already been sucked and held by the suction nozzle 3. However, in a state that the suction face 14 of the suction nozzle 3 is out of contact with a sucked face (top face in the figure) 1a of the component 1, since the tip end portion of the skirt portion 71 of the pad member 22 is adjusted so as to be positioned generally flush with the suction face 14 or slightly upward of the suction face 14, the tip end portion of the skirt portion 71 is out of contact with the sucked face 1a of the component 1 when the tip end portion of the skirt portion 71 is positioned upward of the suction face 14, for example, about 0.1 mm upward.

First, the component mounting head 10 is moved by the XY robot 8 so that the suction nozzle 3 and the component 1 are aligned with each other. Thereafter, in the component mounting head 10, the suction nozzle 3 starts to be moved down. As the suction nozzle 3 is moved down, the tip end of the inclined suction hole 29 of the projecting nozzle 28 that is projected from the suction face 14 (i.e., positioned at a projective position) and the sucked face 1a of the component 1 are brought into contact with each other. Upon this contact, vacuum suction is started through the through hole 17 of the suction nozzle 3 and the inclined suction hole 29. Further, the suction nozzle 3 is moved down so that the projecting-nozzle use compression spring 21 for normally downwardly biasing the projecting nozzle 28 in the contact state is compressed. As a result of this, the projecting nozzle 28 is moved up relative to the through hole 17 of the suction nozzle 3, the inclined suction hole 29 is stored into the through hole 17 (i.e., positioned at the accommodated position).

While the inclined suction hole 29 of the projecting nozzle 28 is stored into the through hole 17, an internal pressure of a space sandwiched by the sucked face 1a of the component 1 and the suction face 14 of the suction nozzle 3 and the skirt portion 71 of the pad member 22 is rapidly lowered by the suction operation. This pressure decrease becomes increasingly noticeable as the distance between the suction face 14 and the sucked face 1a of the component 1 decreases. As a result of this pressure decrease, the skirt portion 71 of the pad member 22 formed from an elastic material is elastically deformed downward and inward, as viewed in the figure, and as a result of this elastic deformation, the tip end portion of the skirt portion 71 and the sucked face 1a of the component 1 are brought closer to each other. Thus, the degree of sealing of the space is enhanced, making the pressure to further decrease, so that as shown in FIG. 11, the suction face 14 of the suction nozzle 3 and the sucked face 1a of the component 1 are brought into contact with each other while the skirt portion 71 of the pad member 22 is further elastically deformed so as to be brought into contact with the sucked face 1a of the component 1. Consequently, the component 1 is sucked and held by the suction nozzle 3 and the pad member 22.

By virtue of the provision of the pad member 22 described above, the suction and holding area can be maintained large, so that reliable, stable suction and holding of large-size, large-weight components 1 can be carried out. Also, by virtue of the provision of the skirt portion 71 described above, reliable suction and holding can be carried out by making use of elastic deformation of the skirt portion 71 caused by the pressure decrease even if more or less depressions and projections or inclined surfaces are involved in the sucked face 1a of the component 1 to be brought into contact with the suction face 14 of the suction nozzle 3. Further, with a view to making it possible for the skirt portion 71 to exert such elastic deformation operation, the skirt portion 71 is desirably formed from an elastic material in a shape that allows the elastic deformation to be done. In the case where the tip end portion of the skirt portion 71 is positioned slightly upward of the suction face 14, the position is preferably set at such a position that the tip end portion is positioned generally flush with the suction face 14 by the elastic deformation of the skirt portion 71. Such a position may be, for example, about 0.1 mm upward of the suction face 14.

Thereafter, with the component 1 sucked and held, the suction nozzle 3 is moved up while the component mounting head 10 is moved to above the board 2 by the XY robot 8, so that alignment between the mounting position for the component 1 in the board 2 and the suction nozzle 3 is performed. Subsequent to this alignment, the suction nozzle 3 starts to be moved down in the component mounting head 10. After that, the sucked and held component 1 is brought into contact with the board 2 so as to be pressed thereagainst, vacuum suction is stopped. Subsequent to this stoppage, the suction nozzle 3 starts to be moved up, where along with this move-up operation, the projecting-nozzle use compression spring 21, which has been in the compressed state, is stretched so that the tip end portion of the projecting nozzle 28 is projected from the suction face 14 of the suction nozzle 3. This projection of the projecting nozzle 28 makes it possible to smoothly and forcedly release the contact state between the sucked face 1a of the component 1 and the suction face 14 and the tip end portion of the skirt portion 71, where the suction nozzle 3 and the component 1 are separated away from each other with the result that the suction and holding state is released. Thus, the component 1 can be mounted to the mounting position in the board 2.

Figure 12:
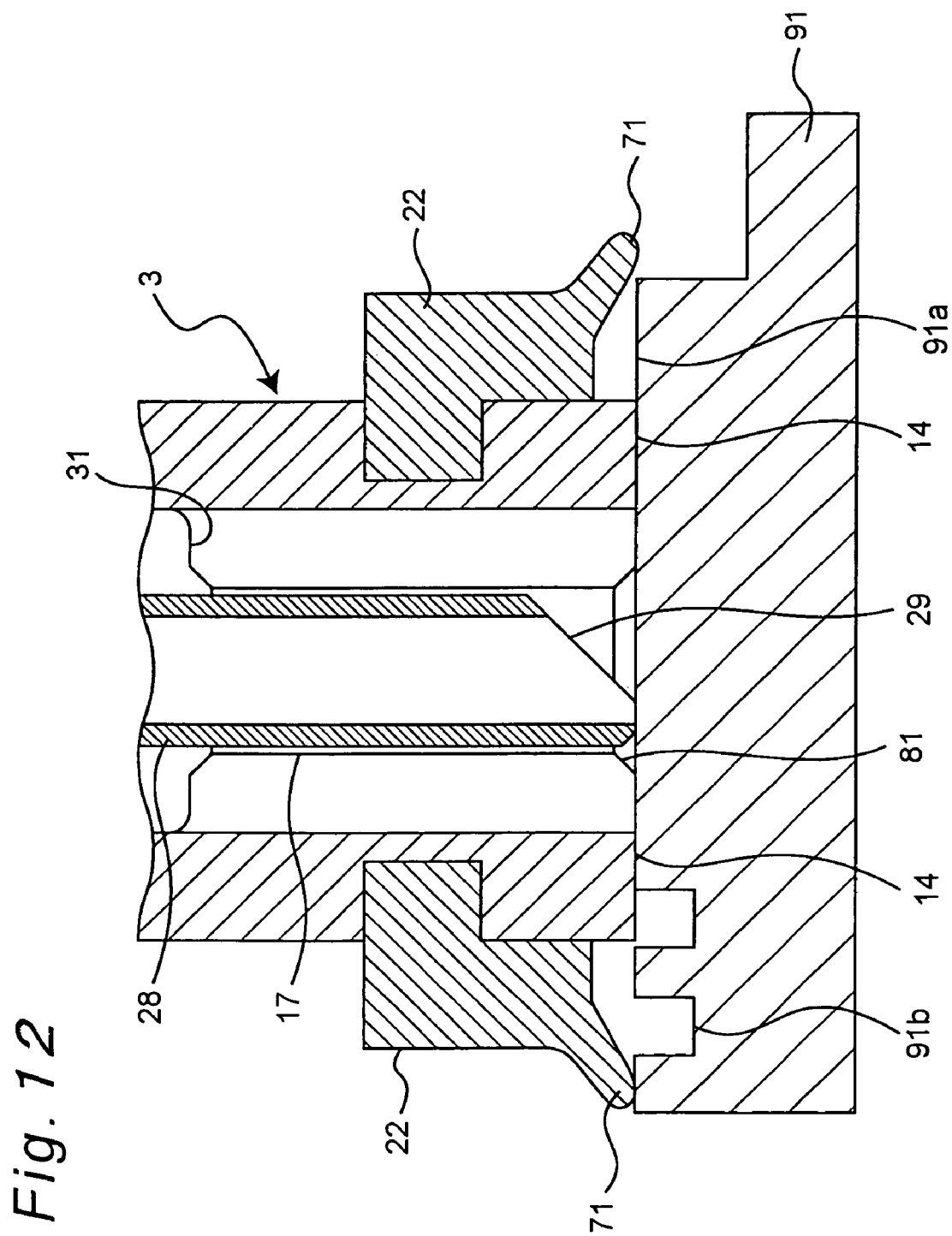
FIG. 12 is a schematic sectional view of the suction nozzle, showing a state that the suction nozzle is sucking and holding a connector component.
Figure 13:
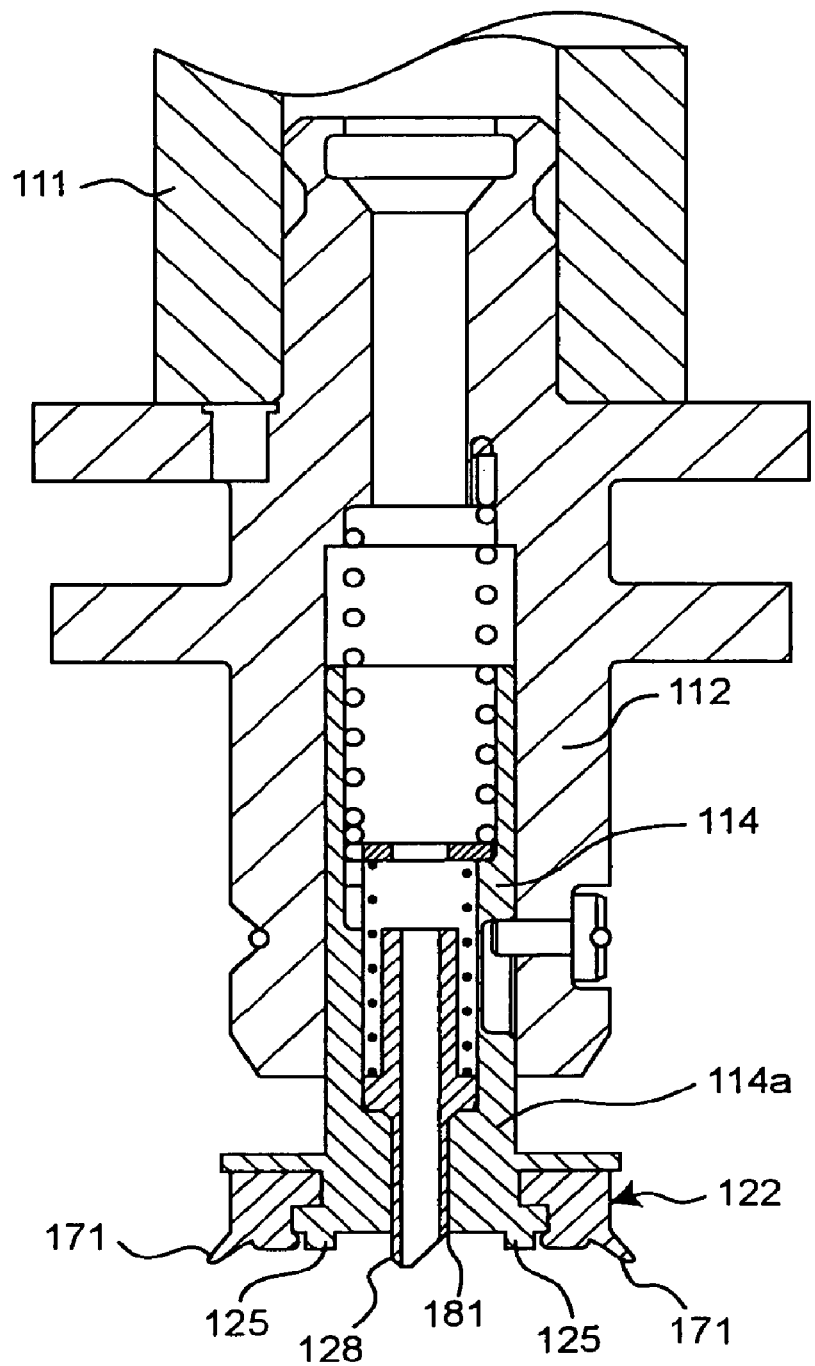
FIG. 13 is a longitudinal sectional view of a component mounting head and a suction nozzle according to a prior art.
Figure 14A:
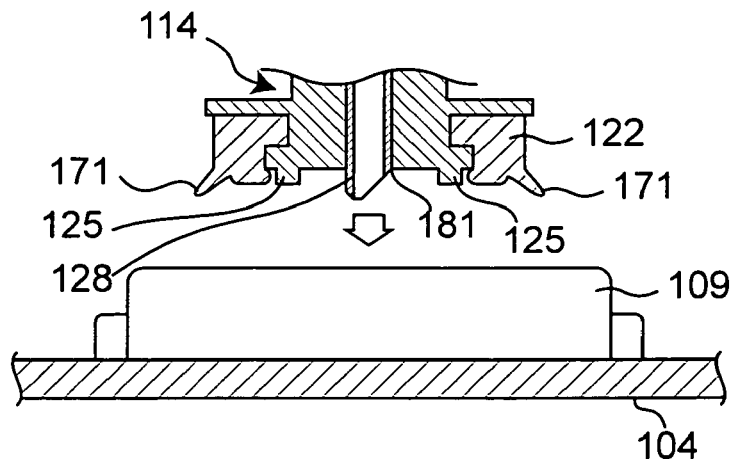
FIG. 14A is a schematic view showing sucking-and-holding and mounting operations of a component by the conventional suction nozzle, showing a state that the suction nozzle is being lowered.
Figure 14B:
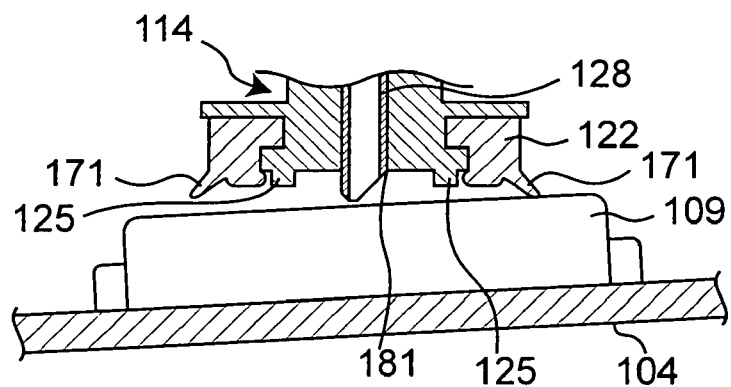
FIG. 14B is a schematic view showing sucking-and-holding and mounting operations of a component by the conventional suction nozzle, showing a state that suction and holding operation is being carried out with the component inclined.
Figure 14C:
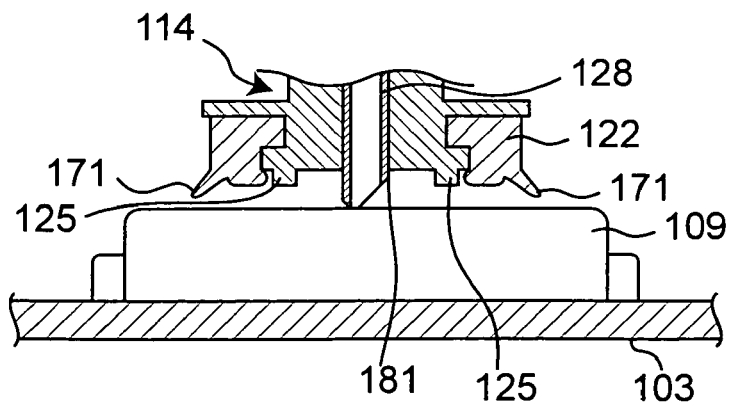
FIG. 14C is a schematic view showing sucking-and-holding and mounting operations of a component by the conventional suction nozzle, showing a state that the sucked and held component is being mounted onto a board.

In another case, FIG. 12 shows a state that a special-shape component mentioned above, for example, a connector component 91 is sucked and held by the suction nozzle 3. As shown in FIG. 12, even if the connector component 91 has a generally rectangular shape as a whole, for example, its sucked face 91a may include not only flat portions but also a depressed/projected portion 91b. In a case where such a depressed/projected portion 91b is placed inside the skirt portion 71 of the pad member 22 as shown in FIG. 12, even with the tip end portion of the skirt portion 71 and the connector component 91 kept in contact with each other, if the depressed/projected portion 91b is opened in a recessed shape as an example, the internal pressure of the space inside the skirt portion 71 cannot be decreased so that the sucking function cannot be achieved at the skirt portion 71.

However, even in such a case, if the suction face 14 of the suction nozzle 3 and the flat portion in the sucked face 91a of the connector component 91 are brought into a reliable contact state, the internal pressure of the space inside the annular suction face 14 can be decreased, so that the connector component 91 can reliably be sucked and held. Such a connector component 91, although being a large-size component in configuration, yet is formed so as to have the depressed/projected portion 91b or hollow shape in many cases and therefore be often relatively lightweight. In particular, by virtue of the adjustment that the tip end portion of the skirt portion 71 is set generally equal in height to the suction face 14, or slightly backward thereof, even when the connector component 91 having such a depressed/projected portion 91b is to be sucked and held, there can be avoided an event that the tip end portion of the skirt portion 71 comes into contact with the connector component 91 earlier than with the suction face 14, inhibiting the contact with between the suction face 14 and the connector component 91.

The above description has been made on a case where the suction nozzle 3 is equipped with the pad member 22 and the projecting nozzle 28, and where large-size components or special-shape components are sucked and held and mounted onto the board 2. Otherwise, the case may be that the suction nozzle 3 is provided with either the pad member 22 or the projecting nozzle 28 only, or that the suction nozzle 3 is provided with neither the pad member 22 nor the projecting nozzle 28. Such provision of the projecting nozzle 28 or the projecting nozzle 28 may be selectively determined depending on the type of the component to be sucked and held. For example, suction and holding of a small-size chip component or the like can be carried out under the condition that the suction nozzle 3 is provided with neither the pad member 22 nor the projecting nozzle 28. However, even under the condition that the suction nozzle 3 is provided with the pad member 22 and the projecting nozzle 28, suction and holding of the chip component can be fulfilled without any problem, in which case of equipment suction and holding of more varieties of configurations and types of components can be fulfilled flexibly and stably.

Now features, functions and effects of minute depressions and projections formed in the suction face 14 of the suction nozzle 3 in the foregoing description are explained in more detail below.

Figure 15:
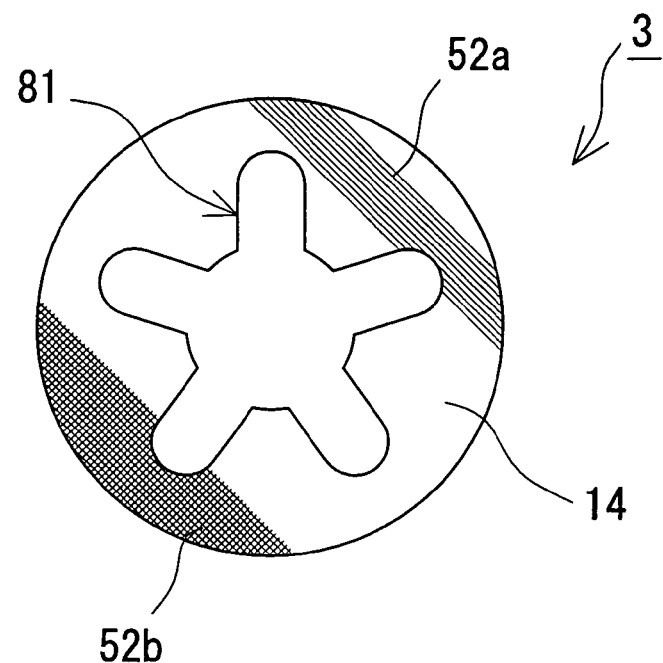
FIG. 15 is a schematic view showing an irregularity portion of a suction face of a suction nozzle according to the being embodiment.

The surface of the suction face 14 of the suction nozzle 3 in this embodiment is so finished minute depressed/projected portions having heights or depths of about 10 to 20 μm, e.g. about 15 μm. Such depressed/projected portions can be formed, for example, by forming recesses 52a having depths of about 15 μm in one direction along the surface of the suction face 14 as shown in FIG. 15. Further, instead of such a case that the one-direction recesses 52a are formed, the can be may be that cross-shaped recesses 52b are formed in mutually intersecting directions (i.e., in two directions) along the surface of the suction face 14 as shown in FIG. 15.

Such recesses 52a, 52b can be formed, for example, by grinding the suction face 14. However, taking into account the fact that the material of the suction nozzle 3 is semiconductor ceramic, those recesses 52a, 52b are preferably formed by preparatorily forming depressed/projected portions corresponding to the individual recesses 52a, 52b at sites in the metal mold (of sintering type) corresponding to the suction face 14. Further, those recesses 52a, 52b are preferably formed so as to make the suction port 81 and outer circumferential end portions of the suction face 14 communicated with each other. In addition, although FIG. 15 exemplarily shows part of the recesses 52a, 52b formed in the suction face 14, the recesses 52a, 52b are formed generally all over the suction face 14.

By the formation of the recesses 52a, 52b serving as the depressed/projected portions in the suction face 14 as described above, the force with which the component 1 is sucked and held to the suction face 14 can be increased, compared with cases where no depressed/projected portions are formed.

Figure 16:
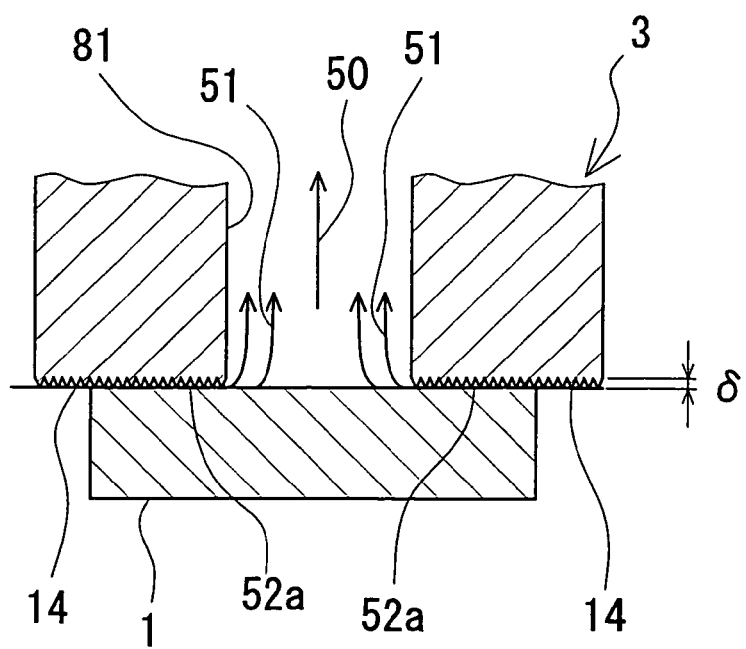
FIG. 16 is a schematic explanatory view for explaining the principle in which suction and holding of a component is carried out by the suction nozzle of FIG. 15.

Effects of the increase of the sucking-and-holding force are explained with reference to a schematic explanatory view representing a partly enlarged sectional view of a vicinity of the suction face 14 of the suction nozzle 3 shown in FIG. 16. As shown in FIG. 16, when the component 1 is sucked and held by the suction face 14, there occurs, between the surface of the suction face 14 and the surface of the component 1, a partial size gap δ corresponding to a formation depth difference each between the individual recess portions 52a (or 52b). By such formation of the gap δ as well as the negative-pressure suction action by the suction port 81 in component suction, air rapidly flows through these gaps δ as shown by arrows 51 to reach the interior of the suction port 81. By the principle that a negative pressure is generated in a rapid flow of fluid through a narrow gap (Bernoulli's principle), a negative pressure is generated between the component 1 and the suction face 14, so that the component 1 is sucked and held to the suction face 14. Such a suction effect by the generation of a negative pressure is referred to as "gap negative-pressure effect."

Also, for the suction nozzle 3, it is possible to increase the sucking-and-holding force by aggressively utilizing sucking-and-holding force obtained by the aforementioned gap negative-pressure effect in addition to sucking-and-holding force (shown by arrow 50) of conventional use to suck the component 1 being in contact with the suction face 14 by a negative-pressure force that is obtained by bringing the internal pressure of the suction port 81 into a negative pressure by suction exerted by a vacuum source for sucking and holding of the component 1. However, for the component mounting apparatus 100, it is not permitted to use a suction nozzle 3 having a suction face 14 larger than the component 1 to be sucked and held from the viewpoint of efficient use of the space. Thus, it is desirable to adopt a hole configuration proper to take a balance between the suction port 81, by which the negative-pressure suction action is generated with a limited space, and the suction face 14, by which the gap negative-pressure effect is generated, and moreover to prevent the component 1 from falling into the suction port 81. An embodiment of such a concept is combinational configurations and sizes of the suction port 81 and the suction face 14 shown in FIG. 7. More specifically, the suction nozzle 3 shown in FIG. 7 is so constituted that the diameter of an outer circumferential circle of the suction face 14 is 5 mm and the diameter of an outer circumferential imaginary circle of the cherry-petal type suction port 81 is 3 mm. Also, since such a gap negative-pressure effect is generated most effectively in the vicinity of the outer circumferential end portion in the suction face 14, positional shifts of the sucking-and-holding position for the component 1 can effectively be suppressed even in the case where, for example, the suction nozzle 3 is rotated about its axial center.

Also, such depressed/projected portions are not limited to cases where they are formed as the recesses 52a arrayed in one direction or the recesses 52b arrayed in a crossing configuration. Instead of such cases, for example, a multiplicity of irregularly arrayed depressed/projected portions may be formed in the suction face 14, so that paths (gaps) to make the suction port 81 and the outer circumferential end portion of the suction face 14 communicated with each other by the presence of such depressed/projected portions. This is because the paths allow a rapid flow of the fluid to be implemented therethrough, by which the "gap negative-pressure effect" can be generated by Bernoulli's principle.

Also, for such irregular depressed/projected portions, for example, depressed/projected portions having depths of about 15 μm can be formed on a surface of the metal mold for the suction nozzle 3 corresponding to the suction face 14, for example, by shot blasting, and the suction nozzle 3 having the irregular depressed/projected portions formed on the suction face 14 can be molded by using the metal mold.

Also, the foregoing description has been made on a case where in the suction face 14 of the suction nozzle 3, as shown in FIG. 7, generally cherry-petal type shaped (i.e. five-petal shaped) openings as the suction port 81 are formed of the generally circular-shaped main hole portion 81a and the five elongate holes 81b placed therearound.

In the case where the suction nozzle 3 is provided in the component mounting head 10 in such a fashion that, for example, the suction port 81 is cherry-petal shaped as described above and the formation direction of one petal (i.e. elongate hole 81b) is aligned with the Y-axis direction, even if a positional shift occurs to the component 1 to be sucked and held in the Y-axis direction, the opening area of the suction port 81 to the atmospheric air can be lessened, as compared with that in the X-axis direction.

In the component mounting apparatus 100, generally, when components 1 are to be extracted from the taped components fed by the component feed cassettes 7, the individual component feed cassettes 7 are placed along the Y-axis direction as shown in FIG. 1. Because of the characteristic that these component feed cassettes 7 feed taped components in the Y-axis direction, their positioning accuracy in the Y-axis direction is lower than that in the X-axis direction. Therefore, when the component 1 fed from the component feed cassettes 7 is sucked and held by the suction nozzle 3, the sucking-and-holding position of the component 1 may more often be shifted in the Y-axis direction. Even in cases where such positional shifts in the Y-axis direction may occur, adopting the aforementioned placement of the suction nozzle 3 makes it possible to minimize the air-opened area due to positional shifts, so that the suction fault rate of the component 1 can be reduced.

Preferably, the suction port 81 of the suction nozzle 3 as described above is formed in such configurations as to have the following respective features.

First, the elongate holes 81b to be formed around the generally circular-shaped main hole portion 81a are, preferably, identical in configuration to one another and arrayed at an equal angular pitch. As a result of this, the sucking-and-holding force applied to the surface of the component 1 through the suction port 81 can be enhanced in uniformity. Further, from such a viewpoint of the uniformity of the sucking-and-holding force, in the case where the suction port 81 is divided into four equal regions around its center, it is preferable that the elongate holes 81b are placed within those regions, respectively.

Also, preferably, the individual elongate holes 81b are not arrayed in point symmetry about the center of the main hole portion 81a. Whereas any positional shift of the sucking-and-holding position of the component 1 with respect to the suction face 14 occurs in one direction with respect to the center of the main hole portion 81a, occurrence of such a positional shift may, in some cases, cause the suction port 81 to be partly opened to the air depending on the degree of the positional shift. However, in the case of a point-asymmetrical placement of the elongate holes 81b, the area of openness to the air, in many cases, can be reduced, compared with cases of a point-symmetrical placement.

Further, preferably, the width of each of the elongate holes 81b is smaller than the diameter of the main hole portion 81a. This makes it possible to reliably prevent the component 1 from entering into the suction port 81 even if the component 1, which is a relatively small-size component, is sucked and held in an oblique posture.

According to this embodiment, various effects described below can be obtained.

First, in the component mounting head 10, the since the suction nozzle 3 is formed not from ceramics having electrical insulation property (see, e.g., Japanese unexamined patent publication No. 2000-151200 A) but from, for example, a semiconductor ceramic made by mixing of carbon particles and ceramics or the like, the suction nozzle 3 formed as such can be made to have characteristics as semiconductor. As a result of this, occurrence of static electricity in the suction nozzle 3 can be prevented, making it possible to reliably prevent the possibilities of contamination of the component due to deposition of dust and dirt or the like caused by the occurrence of the static electricity, as well as electrical damage of the component due to transfer and impartment of the static electricity to the component being in contact with the suction nozzle 3. Also, by virtue of the suction nozzle 3 not having characteristics as electrical conductivity but having characteristics as semiconductor, there occurs no electrical conduction to the component being in contact with the suction nozzle 3, electrical damage of the sucked-and-held component due to the conduction can reliably be prevented. Accordingly, it is possible to provide with a suction nozzle and a component mounting head capable of reliably and stably fulfilling the suction and holding as well as mounting of components that have been advanced to higher functions, higher precision and more diversification.

Also, with the use of a semiconductor ceramic as described above, when its volume resistivity value is set within a range of $10^4$ to $10^8$ $\Omega\cdot$cm, the characteristics as semiconductor can be obtained reliably.

Also, since the suction port 81 formed at the lower face of the suction nozzle 3 is so formed as to have the main hole portion 81a and the elongate holes 81b that are formed integrally with the main hole portion 81a so as to extend radially from the main hole portion 81a, it becomes possible to fulfill stable suction and holding of larger components. Also, in suction and holding of a small-size component, even if it is held in an oblique-suction posture, the possibility of occurrence of an event that the sucked-and-held component may fit and enter into the suction port 81 can be reduced to a large extent. Thus, it becomes implementable to fulfill reliable and stable suction and holding of various components ranging from small-size components to large-size components and further to special-shape components.

Also, even in the case where the projecting nozzle 28 that slides along the through hole 17 of the suction nozzle 3 is provided, since the projecting nozzle 28 slides along a portion of the through hole 17 corresponding to the main hole portion 81a and the projecting nozzle 28 is not placed at portions of the through hole 17 corresponding to the respective elongate holes 81b, the possibility of occurrence of an event that the projecting nozzle 28 is inhibited from sliding due to the suction of dust and dirt or the like through the suction port 81 can be reduced to a large extent. Accordingly, it becomes implementable to fulfill stable operation of the projecting nozzle 28. Also, the provision of such a projecting nozzle 28 makes it possible to aid the suction operation in the suction nozzle 3 as well as to aid the suction-and-holding release operation of the sucked-and-held component. Moreover, the formation of the projecting nozzle 28 from the semiconductor ceramics allows the same effects as with the suction nozzle 3 to be obtained.

Also, in the suction nozzle 3, in which the suction face 14 to be brought into contact with the component is so surface-finished that a multiplicity of depressed/projected portions having heights or depends within a range of about 10 to 20 μm are formed therein, occurrence of slide between the component and the suction face 14 in the suction and holding of the component can be reduced, making it possible to achieve reliable, stable suction and holding. Moreover, the formation of such depressed/projected portions allows the gap negative-pressure effect to be utilized in addition to the foregoing vacuum-source negative-pressure effect, so that more reliable suction and holding can be achieved.

Also, by the formation of the depressed/projected portions in the suction face 14 as described above, for example, when an image of a state that the component is sucked and held is captured from below the suction nozzle 3, light applied to the suction face 14 can be diffusely reflected by the depressed/projected portions, thus producing an effect that the component image can reliably be captured. In particular, with a normal ceramic used, since the ceramic tends to glitter, the suction face of the suction nozzle may glitter in reflection and recognition of the component, posing a problem that the component image cannot be captured clearly in some cases. Thus, the contrivances described above make it possible to solve these problems.

For reliable capture of component images, it is also effective to set the color of the suction face 14 of the suction nozzle 3 to black, or to set the configuration of the suction face 14 to a circular one by taking into consideration that the components 1 are rectangular-shaped in many cases.

Also, for the formation of the depressed/projected portions as described above, taking into account that the suction nozzle 3 is formed from a semiconductor ceramic, performing shot blasting on the ceramic as in, for example, Japanese unexamined patent publication No. 2000-151200 A to form the depressed/projected portions would cause occurrence of cracks or instability of the processed surface, posing problems such as higher possibilities of occurrence of sagging at end portions and further elongated processing time. Besides, performing the electrodeposition of diamond particles on the suction nozzle 3 to form the depressed/projected portions as in Japanese unexamined patent publication No. 2002-233983 A, although implementable when the suction nozzle is formed from a metal material or the like, is impossible when the suction nozzle is formed from ceramics, disadvantageously.

In order to solve these and other problems, in this embodiment, electrodepositing diamond particles on the metal mold itself and molding the suction nozzle 3 from semiconductor ceramics by using this metal mold makes it possible to form the depressed/projected portions reliably and simply.

Also, by the suction nozzle 3 further including the pad member 22, the skirt portion 71 included in the pad member 22 can aid the suction and holding of the component by the suction face 14. In particular, by the arrangements that the height position of the tip end of the skirt portion 71 is set to a height position generally equal to or slightly backward of the height position of the suction face 14, and that the skirt portion 71 is formed from an elastic material, it becomes possible to reliably prevent the possibility of occurrence of an event that, in the suction and holding of the component by the suction nozzle 3, the tip end portion of the skirt portion 71 makes contact with the component earlier than the suction face 14 to inhibit the suction of the component by the suction face 14.

Also, the skirt portion 71 is formed from the elastic material, and while the skirt portion 71 is kept close to the top portion of the component, the tip end portion of the skirt portion 71 can be elastically deformed inwardly downward as the internal pressure of the space sandwiched by the skirt portion 71 and the top portion of the component is decreased. Therefore, by this deformation, the tip end portion of the skirt portion 71 can reliably be brought into contact with the top portion of the component. Accordingly, reliable suction and holding of the component can be achieved by the skirt portion 71. Such suction and holding being implementable, the region in the suction nozzle 3 where the suction and holding can be carried out can be expanded up to a region surrounded by the outer circumferential end portion of the skirt portion 71, thus making it possible to fulfill the suction and holding of large-size components and special-shape components. Further, for small-size components that are almost free from contact with the tip end portion of the skirt portion 71, bringing the suction face 14 into contact with the component makes it possible to achieve reliable suction and holding regardless of the presence or absence of the skirt portion 71. Thus, it becomes implementable to fulfill the suction and holding of diversified components of various configurations ranging from small-size components to large-size components and further to special-shape components, flexibly and promptly.

It is to be noted that, by properly combining the embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2003-422209 filed on Dec. 19, 2003 including specification, drawing and claims are incorporated herein by reference in its entirety.

The invention claimed is:

1. A component mounting head for sucking and holding a component so as to place the component at a component mounting position on a board and for releasing the suction and holding of the component to mount the component onto the component mounting position, the component mounting head comprising:
   a suction nozzle including a suction-and-holding face for sucking and holding the component; and
   an auxiliary suction member which is formed from an elastic material, the auxiliary suction member having an inner circumferential end portion and an outer circumferential end portion,
   wherein a suction hole is defined in the suction-and-holding face, the suction hole having a main hole portion and five extended hole portions,
   wherein the main hole portion is formed in a circular shape or a generally circular shape and is concentric with an axial center of the suction nozzle,
   wherein the five extended hole portions extend from the main hole portion in five radial directions, respectively, at a generally uniform angular pitch,
   wherein the five extended hole portions are integrally formed with the main hole portion such that the suction hole constitutes a single hole formed collectively by the main hole portion and the five extended hole portions,
   wherein the inner circumferential end portion of the auxiliary suction member is placed in close contact with an outer circumferential portion of the suction nozzle,
   wherein the outer circumferential end portion of the auxiliary suction member projects outwardly from a circumferential portion of the suction-and-holding face,
   wherein the outer circumferential end portion of said auxiliary suction member is placed at a position generally equal in height to the suction-and-holding face or slightly backward of the suction-and-holding face,
   wherein the suction nozzle includes an auxiliary suction member fitting portion which is set at an outer circumferential portion thereof such that the inner circumferential end portion of the auxiliary suction member is attached thereto and detachable therefrom,
   wherein the auxiliary suction member is selectively attached to the auxiliary suction member fitting portion depending on size of the component to be sucked and held,
   wherein a fixing member is provided for loading the auxiliary suction member to the auxiliary suction member fitting portion by releasably fixing a contact position of the inner circumferential end portion of the auxiliary suction member against the auxiliary suction member fitting portion, and
   wherein a height position of the outer circumferential end portion of the auxiliary suction member is adjustable by adjusting the contact position in a direction parallel to a longitudinal axis of the suction nozzle, the contact position being fixed by the fixing member.

2. A component mounting head for sucking and holding a component so as to place the component at a component mounting position on a board and for releasing the suction and holding of the component to mount the component onto the component mounting position, the component mounting head comprising:

a suction nozzle including a suction-and-holding face for sucking and holding the component; and an auxiliary suction member which is formed from an elastic material, the auxiliary suction member having an inner circumferential end portion and an outer circumferential end portion, wherein a suction hole is defined in the suction-and-holding face for sucking up the component, the suction hole having a main hole portion and a plurality of extended hole portions, wherein the main hole portion is formed in a circular shape or a generally circular shape, wherein the plurality of extended hole portions extend from the main hole portion in a plurality of radial directions, respectively, at a generally uniform angular pitch, wherein the plurality of extended hole portions are integrally formed with the main hole portion such that the suction hole constitutes a single hole formed collectively by the main hole portion and the plurality of extended hole portions, wherein the inner circumferential end portion of the auxiliary suction member is placed in close contact with an outer circumferential portion of the suction nozzle, wherein the outer circumferential end portion of the auxiliary suction member projects outwardly from a circumferential portion of the suction-and-holding face, wherein the outer circumferential end portion of said auxiliary suction member is placed at a position generally equal in height to the suction-and-holding face or slightly backward of the suction-and-holding face, wherein the suction nozzle includes an auxiliary suction member fitting portion which is set at an outer circumferential portion thereof such that the inner circumferential end portion of the auxiliary suction member is attached thereto and detachable therefrom, wherein the auxiliary suction member is selectively attached to the auxiliary suction member fitting portion depending on size of the component to be sucked and held, wherein a fixing member is provided for loading the auxiliary suction member to the auxiliary suction member fitting portion by releasably fixing a contact position of the inner circumferential end portion of the auxiliary suction member against the auxiliary suction member fitting portion, and wherein a height position of the outer circumferential end portion of the auxiliary suction member is adjustable by adjusting the contact position in a direction parallel to a longitudinal axis of the suction nozzle, the contact position being fixed by the fixing member.

3. The component mounting head as defined in claim 2, wherein the suction nozzle is operable to suck and hold at a component extraction position components fed from a component feed cassette, the component feed cassette accommodating a plurality of the components and feeding out the accommodated components along a component feed direction such that the components are positioned at the component extraction position, and wherein the suction nozzle is arranged such that the component feed direction of the component feed cassette is coincident with an extending direction of one of the extended hole portions.

4. The component mounting head as defined in claim 3, wherein the main hole portion has a diameter d, a diameter of an outer circumferential end portion of the suction-and-holding face is approximately 3 d, a width of each of the extended hole portions is approximately 0.4 d, and a distance from an axial center of the main hole portion to a distal end of each extended hole portion is approximately 2 d.

5. The component mounting head as defined in claim 4, wherein the suction-and-holding face of the suction nozzle is surface finished so as to have a multiplicity of depressed/projected portions having heights or depths of about 10 to 20 µm.

6. The component mounting head as defined in claim 5, wherein the multiplicity of depressed/projected portions are recess portions which are formed in the suction-and-holding face so as to make the suction hole and an outer circumferential end portion of the suction-and-holding face communicated with each other.

7. The component mounting head as defined in claim 2, wherein the suction nozzle comprises:

a projecting member having a tip end portion, the projecting member being disposed within the main hole portion for sliding between a projective position in which the tip end portion is projected from the suction-and-holding face and an accommodated position in which the tip end portion of the projecting member is positioned more inwardly toward the suction-and-holding face than in the projective position; and a biasing member for biasing the projecting member toward the projective position.

8. The component mounting head as defined in claim 7, wherein the tip end portion of the projecting member is formed of a semiconductor ceramic.

* * * * *